United States Patent
Ohashi et al.

(10) Patent No.: US 7,719,447 B2
(45) Date of Patent: May 18, 2010

(54) VARIABLE LENGTH DECODING METHOD AND DEVICE

(75) Inventors: Masahiro Ohashi, Fukuoka (JP); Tsuyoshi Nakamura, Fukuoka (JP)

(73) Assignee: Panasonic Corporation, Osaka (JP)

(*) Notice: Subject to any disclaimer, the term of this patent is extended or adjusted under 35 U.S.C. 154(b) by 59 days.

(21) Appl. No.: 12/243,231

(22) Filed: Oct. 1, 2008

(65) Prior Publication Data

US 2009/0085781 A1    Apr. 2, 2009

Related U.S. Application Data

(62) Division of application No. 11/475,893, filed on Jun. 28, 2006, now Pat. No. 7,432,835.

(30) Foreign Application Priority Data

Jul. 5, 2005 (JP) .............................. 2005-196050

(51) Int. Cl.
*H03M 7/40* (2006.01)
(52) U.S. Cl. .......................................... 341/67; 341/51
(58) Field of Classification Search ................. 341/67, 341/65, 51; 375/240.02
See application file for complete search history.

(56) References Cited

U.S. PATENT DOCUMENTS 6,144,322 A * 11/2000 Sato ............................. 341/67
6,633,608 B1   10/2003 Miller

FOREIGN PATENT DOCUMENTS

JP        9-185548        7/1997

* cited by examiner

*Primary Examiner*—Rexford N Barnie
*Assistant Examiner*—Joseph Lauture
(74) *Attorney, Agent, or Firm*—Wenderoth, Lind & Ponack, L.L.P.

(57) ABSTRACT

A variable length decoding device comprises a CPU, a variable length decoding unit, an encoded data memory, a decoded data memory, and a mass memory. The variable length decoding unit comprises a decoding table memory operable to store decoding table, a standard information storage unit operable to store standard information of encoded data, and a frequency information storage unit operable to store information on frequency of usage of each table element of the decoding table. According to the structure, the decoding table is not necessary to transfer when decoding the encoded data based on the same standard of the previously-decoded encoded data. The decoding table to be stored in the decoding table memory can be composed by table elements of higher frequency of usage, thereby decreasing occurrence of cache error.

2 Claims, 20 Drawing Sheets

Fig. 10(a)

| ID number | frequency information number | standard | decoding process time |
|---|---|---|---|
| ID003 | INFO-3 | MPEG-4 | 2005.06.01;10:15 |
| ID002 | INFO-2 | H.263 | 2005.05.25;12:00 |
| ID001 | INFO-1 | MPEG-2 | 2005.04.30;19:30 |
| | | | |
| | | | |

Fig. 10(b)

| ID number | frequency information number | standard | decoding process time |
|---|---|---|---|
| ID001 | INFO-1 | MPEG-2 | 2005.06.10;08:15 |
| ID003 | INFO-3 | MPEG-4 | 2005.06.01;10:15 |
| ID002 | INFO-2 | H.263 | 2005.05.25;12:00 |
| | | | |
| | | | |

Fig. 10(c)

| ID number | frequency information number | standard | decoding process time |
|---|---|---|---|
| ID004 | INFO-4 | MPEG-4 | 2005.06.15;20:30 |
| ID001 | INFO-1 | MPEG-2 | 2005.06.10;08:15 |
| ID003 | INFO-3 | MPEG-4 | 2005.06.01;10:15 |
| ID002 | INFO-2 | H.263 | 2005.05.25;12:00 |
| | | | |

Fig. 11

| | L_1 | L_2 | L_3 | L_4 | L_5 | L_6 | L_7 | L_8 | L_9 | L_10 | L_11 | L_12 |
|---|---|---|---|---|---|---|---|---|---|---|---|---|
| R_0 | 0 | 1 | 2 | 3 | 4 | 5 | 6 | 7 | 8 | 9 | A | B |
| R_1 | C | D | E | F | 10 | 11 | | | | | | |
| R_2 | 12 | 13 | 14 | 15 | | | | | | | | |
| R_3 | 16 | 17 | 18 | | | | | | | | | |
| R_4 | 19 | 1A | 1B | | | | | | | | | |
| R_5 | 1C | 1D | 1E | | | | | | | | | |
| R_6 | 1F | 20 | 21 | | | | | | | | | |
| R_7 | 22 | 23 | | | | | | | | | | |
| R_8 | 24 | 25 | | | | | | | | | | |
| R_9 | 26 | 27 | | 105 | | | | | | | | |
| R_10 | 28 | 29 | | | | | | | | | | |
| R_11 | 3A | | | | | | | | | | | |
| R_12 | 3B | | | | | | | | | | | |
| R_13 | 3C | | | | | | | | | | | |
| R_14 | 3D | | 110 | | | | | | | | | |
| R_15 | 3F | | | | | | | | | | | |
| R_16 | 40 | | | | | | | | | | | |
| R_17 | 41 | | | | | | | | | | | |
| R_18 | 42 | | | | | | | | | | | |
| R_19 | 43 | | | | | | | | | | | |
| R_20 | 44 | | | | | | | | | | | |
| R_21 | 45 | | | | | | | | | | | |
| R_22 | 46 | | | | | | | | | | | |
| R_23 | 47 | | | | | | | | | | | |
| R_24 | 48 | | | | | | | | | | | |
| R_25 | 49 | | | | | | | | | | | |
| R_26 | 50 | | | | | | | | | | | |

Fig. 12

| | L_1 | L_2 | L_3 | L_4 | L_5 | L_6 | L_7 | L_8 | L_9 | L_10 | L_11 | L_12 |
|---|---|---|---|---|---|---|---|---|---|---|---|---|
| R_0 | 10 | 6 | 0 | 0 | 0 | 0 | 0 | 0 | 0 | 0 | 0 | 0 |
| R_1 | 7 | 6 | 0 | 0 | 0 | 0 | | | | | | |
| R_2 | 6 | 4 | 0 | 0 | | | | | | | | |
| R_3 | 3 | 4 | 0 | | | | | | | | | |
| R_4 | 4 | 5 | 0 | | | | | | | | | |
| R_5 | 3 | 2 | 0 | | | | | | | | | |
| R_6 | 2 | 1 | 0 | | | | | | | | | |
| R_7 | 0 | 0 | | | | | | | | | | |
| R_8 | 2 | 0 | | | | | | | | | | |
| R_9 | 2 | 0 | | 120 | | | | | | | | |
| R_10 | 0 | 0 | | | | | | | | | | |
| R_11 | 0 | | | | | | | | | | | |
| R_12 | 0 | | | | | | | | | | | |
| R_13 | 0 | | | | | | | | | | | |
| R_14 | 0 | | | | | | | | | | | |
| R_15 | 0 | | | | | | | | | | | |
| R_16 | 0 | | | | | | | | | | | |
| R_17 | 0 | | | | | | | | | | | |
| R_18 | 0 | | | | | | | | | | | |
| R_19 | 0 | | | | | | | | | | | |
| R_20 | 0 | | | | | | | | | | | |
| R_21 | 0 | | | | | | | | | | | |
| R_22 | 0 | | | | | | | | | | | |
| R_23 | 0 | | | | | | | | | | | |
| R_24 | 0 | | | | | | | | | | | |
| R_25 | 0 | | | | | | | | | | | |
| R_26 | 0 | | | | | | | | | | | |

Fig. 13

| | L_1 | L_2 | L_3 | L_4 | L_5 | L_6 | L_7 | L_8 | L_9 | L_10 | L_11 | L_12 |
|---|---|---|---|---|---|---|---|---|---|---|---|---|
| R_0 | 433 | 134 | 61 | 18 | 10 | 7 | 4 | 4 | 6 | 1 | 3 | 1 |
| R_1 | 231 | 43 | 19 | 3 | 2 | 3 | | | | | | |
| R_2 | 177 | 19 | 5 | 1 | | | | | | | | |
| R_3 | 134 | 14 | 1 | | | | | | | | | |
| R_4 | 88 | 8 | 5 | | | | | | | | | |
| R_5 | 79 | 5 | 2 | | | | | | | | | |
| R_6 | 68 | 5 | 3 | | | | | | | | | |
| R_7 | 48 | 6 | | | | | | | | | | |
| R_8 | 70 | 5 | | | | | | | | | | |
| R_9 | 92 | 12 | | | | | | | | | | |
| R_10 | 49 | 8 | | | | | | | | | | |
| R_11 | 32 | | | | | | | | | | | |
| R_12 | 14 | | 130 | | | | | | | | | |
| R_13 | 11 | | | | | | | | | | | |
| R_14 | 7 | | | | | | | | | | | |
| R_15 | 12 | | | | | | | | | | | |
| R_16 | 11 | | | | | | | | | | | |
| R_17 | 8 | | | | | | | | | | | |
| R_18 | 8 | | | | | | | | | | | |
| R_19 | 17 | | | | | | | | | | | |
| R_20 | 18 | | | | | | | | | | | |
| R_21 | 11 | | | | | | | | | | | |
| R_22 | 4 | | | | | | | | | | | |
| R_23 | 2 | | | | | | | | | | | |
| R_24 | 1 | | | | | | | | | | | |
| R_25 | 2 | | | | | | | | | | | |
| R_26 | 1 | | | | | | | | | | | |

Fig. 14

| address | table data |
|---------|------------|
| 0 | R_0, L_1 |
| 1 | R_0, L_2 |
| 2 | R_1, L_1 |
| 3 | R_1, L_2 |
| 4 | R_2, L_1 |
| 5 | R_2, L_2 |
| 6 | R_3, L_1 |
| 7 | R_3, L_2 |
| 8 | R_4, L_1 |
| 9 | R_4, L_2 |
| A | R_5, L_1 |
| B | R_5, L_2 |
| C | R_6, L_1 |
| D | R_6, L_2 |
| E | R_7, L_1 |
| F | R_7, L_2 |
| 10 | R_8, L_1 |
| 11 | R_8, L_2 |
| 12 | R_9, L_1 |
| 13 | R_9, L_2 |

Fig. 15

| address | table data | remarks |
|---|---|---|
| 0 | R_0, L_1 | |
| 1 | R_0, L_2 | |
| 2 | R_1, L_1 | |
| 3 | R_1, L_2 | |
| 4 | R_2, L_1 | |
| 5 | R_2, L_2 | |
| 6 | R_3, L_1 | |
| 7 | R_3, L_2 | |
| 8 | R_4, L_1 | |
| 9 | R_4, L_2 | |
| A | R_5, L_1 | |
| B | R_5, L_2 | |
| C | R_6, L_1 | |
| D | R_10, L_1 | replaced |
| E | R_11, L_1 | replaced |
| F | R_12, L_2 | replaced |
| 10 | R_8, L_1 | |
| 11 | R_13, L_1 | replaced |
| 12 | R_9, L_1 | |
| 13 | R_14, L_1 | replaced |

VARIABLE LENGTH DECODING METHOD AND DEVICE

This is a Rule 1.53(b) Divisional of application Ser. No. 11/475,893, filed Jun. 28, 2006 now U.S. Pat. No. 7,432,835.

BACKGROUND OF THE INVENTION

1. Field of the Invention

The present invention relates to a variable length decoding method and device operable to decode variable-length-encoded image data.

2. Description of the Related Art

As a system which performs encoding and decoding for motion picture data using a bandwidth compression technology, there are MPEG-2 and MPEG-4 systems standardized by MPEG (Moving Picture Experts Group) of ISO, and H.263 system recommended by ITU-T (International Telecommunication Union-Telecommunication Standardization Sector).

These systems are based on use of intra-picture correlation and inter-picture correlation of the motion picture. A picture is divided into blocks each of which is composed of several pixels, and data in the blocks are transformed by discrete cosine transformation (abbreviated as DCT), which is one of the orthogonal transformation methods. Then, quantization and variable-length-code encoding (abbreviated as VLC encoding) is performed, thereby, attaining highly-compressed encoding of the picture data.

The VLC encoding performs coding by assigning a unique code to a combination (Last, Run, Level) of the DCT coefficients obtained as a result of DCT, where "Run" means the number of preceding zero coefficients, "Level" means the value of a non-zero coefficient, and "Last" means whether the non-zero coefficient is the last one or not. In assigning codes, shorter codes are assigned to combinations (Last, Run, Level) with high frequency of appearance, thereby coding of a high compressibility is realized. In these coding systems, variable length code tables are specified in order to assign unique codes to all of the combinations (Last, Run, Level).

The VLC encoded data is decoded at high speed using a variable-length-code decoding table which is reversely generated from the variable length code table. What is posed as a problem in the decoding is how to store the variable-length-code decoding table.

Document 1 (Published Japanese patent application No. H09-185548) discloses a memory controlling method including storing a variable-length-code decoding table to a cache memory in variable length decoding processing.

FIG. 21 is a block diagram illustrating the conventional cache memory controller, which the Document 1 discloses. The cache memory controller shown in FIG. 21 comprises a control circuit (CONTROL) 1, an instruction memory (IMEM) 2, CPU 3, a data bus 6, a data memory (DMEM) 7, a first data cache (DCACHE) 8, a second data cache (DCACHE) 9, a selector 10, and a selector 11. CPU 3 includes a part of a register file (REG) 4, an arithmetic-logic circuit (ALU) 5, and a control circuit 1. The first data cache 8 and the second data cache 9 are memories operable to read/write data at high speed, and perform an exchange of data from and to the register file 4 and the arithmetic-logic circuit 5, via the selector 11 and the data bus 6. In the conventional cache memory controller shown in FIG. 21, a variable-length-code decoding table is stored in the first data cache 8 and the second data cache 9, thereby performing the decoding processing.

In the conventional cache memory controller, the decoding processing is performed using the variable-length-code decoding table stored in the cache memories. Therefore, each time when decoding data with different variable length coding standards, it is necessary to replace the contents of the cache memory with the variable-length-code decoding table of the standard concerned. Cache memory is a memory of a small capacity and cannot store all the variable-length-code decoding tables. Therefore, when there are no data needed at the time of decoding on the cache memory, the so-called cache error occurs and replacement processing becomes necessary for newly storing other portions of the variable-length-code decoding table to the cache memory.

Thus, the conventional cache memory controller has to solve subjects such as the increase in the processing amount resulting from the replacement processing of the variable-length-code decoding table, and the accompanying increase in the power consumption thereof.

OBJECTS AND SUMMARY OF THE INVENTION

In view of the above, an object of the present invention is to provide a variable length decoding method and device which aim at reduction of the frequency of replacement of a variable-length-code decoding table, and reduction of the frequency of cache error in decoding of the variable length encoded data based on various standards.

A first aspect of the present invention provides a variable length decoding method operable to perform decoding of encoded data which is variable-length-encoded in conformity with one of a plurality of standards, the variable length decoding method comprising: retrieving a decoding table in correspondence to a target standard of encoded data to be decoded from the mass memory which possesses a plurality of decoding tables, each of the plurality of decoding tables corresponding to each of the plurality of standards; performing a first storing of the decoding table retrieved in the retrieving to a decoding table memory; performing a second storing of standard information of the target standard to a standard information storage unit; comparing the target standard of the encoded data to be decoded with a standard of previously-decoded encoded data, with reference to the standard information stored in the standard information storage unit; and variable-length-decoding the encoded data, using the decoding table stored in the decoding table memory. When the comparing determines that the target standard of the encoded data to be decoded is identical with the standard of the previously-decoded encoded data, the variable-length-decoding includes decoding the encoded data using the decoding table already stored in the decoding table memory. When the comparing determines that the target standard of the encoded data to be decoded is not identical with the standard of the previously-decoded encoded data, the retrieving includes retrieving a decoding table of the target standard from the mass memory, the performing the first storing includes storing the retrieved decoding table to the decoding table memory, the variable-length-decoding includes decoding the encoded data using the decoding table of the target standard newly stored in the decoding table memory, and the performing the second storing includes newly storing standard information of the target standard to the standard information storage unit.

According to the method, when the encoded data to be decoded is found to be based on the same standard as the previously-decoded encoded data, reference to the standard information stored in the standard information storage unit makes it unnecessary to transfer (or download) the decoding table of the standard concerned from the mass memory to the decoding table memory. Therefore, it is possible to reduce the processing and power consumption which are otherwise needed for the transfer of the decoding table of the standard concerned.

A second aspect of the present invention provides, in addition to the first aspect, the variable length decoding method, wherein the standard information is notified in company with the encoded data, and the comparing includes performing comparison with reference to the notified standard information.

A third aspect of the present invention provides, in addition to the first aspect, the variable length decoding method further comprising analyzing a bit stream of the encoded data to specify the target standard on which the encoded data is based, thereby generating standard information newly, wherein the comparing includes referring to the standard information generated in the analyzing.

According to these methods, the standard information can be acquired by a notice from the outside, or when there is no notice from the outside, by analyzing the bit stream of the encoded data to decode. With reference to the standard information acquired in this way, it can be judged whether it is necessary to transfer the decoding table from the mass memory to the decoding table memory.

A fourth aspect of the present invention provides, in addition to the first aspect, the variable length decoding method further comprising performing a third storing, to a frequency information storage unit, of frequency information indicating frequency of usage that each table data of the decoding table of the target standard is used in decoding encoded data, wherein the performing the first storing includes storing a part of the table data of the decoding table to the decoding table memory in higher order of the frequency of usage, with reference to the frequency information stored in the frequency information storage unit.

According to the method, even when the decoding table memory adopts a cache memory which can store a part of table data of the decoding table, a frequently-used table data can be stored preferentially to the cache memory. Consequently, the probability of occurrence of the cache error in decoding processing can be reduced. Therefore, the frequency of transfer processing of the decoding table accompanying the occurrence of cache error can be reduced; thereby making it possible to realize improvement in the speed of decoding processing and reduction of power consumption thereof.

A fifth aspect of the present invention provides, in addition to the fourth aspect, the variable length decoding method, wherein the frequency information is stored in linkage with identification information by which the variable-length-decoded encoded data is discerned, and wherein, in decoding new encoded data, the performing the first storing includes referring to frequency information linked with identification information of the new encoded data, among a plurality of pieces of frequency information stored in the frequency information storage unit, and storing, to the decoding table memory, frequently-used table data among the table data of the decoding table.

According to the method, in decoding the encoded data, the frequency information with the same identification number of the encoded data decoded in the past can be employed by referring to the identification number. Therefore, when reproducing again the motion picture reproduced in the past, the frequently-used table data among the table data of the decoding table can be stored in the decoding table memory using the frequency information. Consequently, the probability of occurrence of the cache error in decoding processing can be reduced, and efficient decoding can be realized.

A sixth aspect of the present invention provides, in addition to the first aspect, the variable length decoding method further comprising performing a fourth storing, to an order information storage unit, of order information indicating order of usage that each table data of the decoding table of the target standard is used in decoding encoded data, wherein the performing the first storing includes storing a part of the table data of the decoding table to the decoding table memory in the order of usage, with reference to the order information stored in the order information storage unit.

According to the method, even when the decoding table memory adopts a cache memory which can store a part of the table data of the decoding table, the part of the table data can be stored to the cache memory in the order of usage that each table data was used in the past decoding of the same encoded data. Consequently, the occurrence of the cache error in decoding processing can be avoided. Therefore, the transfer processing of the decoding table accompanying otherwise occurring cache error becomes unnecessary; thereby making it possible to realize improvement in the speed of decoding processing and reduction of power consumption thereof.

A seventh aspect of the present invention provides, in addition to the sixth aspect, the variable length decoding method, wherein the order information is stored in linkage with identification information by which the variable-length-decoded encoded data is discerned, and wherein, in decoding new encoded data, the performing the first storing includes referring to order information linked with identification information of the new encoded data, among a plurality of pieces of order information stored in the order information storage unit, and storing, to the decoding table memory, the table data of the decoding table in the order of usage.

According to the method, in decoding the encoded data, the order information with the same identification number of the encoded data decoded in the past can be employed by referring to the identification number. Therefore, when reproducing again the motion picture reproduced in the past, the table data of the decoding table can be stored in the decoding table memory in the order of usage by referring to the order information. Consequently, the occurrence of the cache error in decoding processing can be avoided, and efficient decoding can be realized.

An eighth aspect of the present invention provides a variable length decoding device operable to perform decoding of encoded data which is variable-length-encoded in conformity with one of a plurality of standards, the variable length decoding device comprising: a processor; a mass memory operable to store a plurality of decoding tables to be referred to in decoding the encoded data, each of the plurality of decoding tables corresponding to each of the plurality of standards; an encoded data memory operable to store the encoded data; variable length decoding unit operable, under the control of the processor, to decode the encoded data stored in the encoded data memory, thereby generating decoded data; a decoded data memory operable to store the decoded data; and a standard information storage unit operable to store standard information on a target standard on which the encoded data is based. The variable length decoding unit comprises: a control unit operable to control decoding process of the encoded data; and a decoding table memory operable to store a decoding table of the target standard.

According to the structure, it is possible to provide the variable length decoding device operable to perform efficiently the variable length decoding of encoded data which is variable-length-encoded according to a certain standard of a plurality of standards. The variable length decoding device of the present structure can perform the decoding processing efficiently, since only the table data of a standard required for decoding is stored in the decoded data memory from the mass memory which possesses all the decoding tables of a plurality of standards.

A ninth aspect of the present invention provides, in addition to the eighth aspect, the variable length decoding device, wherein the processor compares the target standard with a standard of previously-decoded encoded data, with reference to the standard information stored in the standard information storage unit, thereby generating a comparison result. When the comparison result determines that the target standard of the encoded data is identical with the standard of the previously-decoded encoded data, the variable length decoding unit decodes the encoded data using the decoding table already stored in the decoding table memory. When the comparison result determines that the target standard of the encoded data is not identical with the standard of the previously-decoded encoded data, the processor stores new standard information on the target standard to the standard information storage unit and transfers a decoding table of the target standard from the mass memory to the decoding table memory, and the variable length decoding unit decodes the encoded data using the transferred decoding table.

According to the structure, comparison to determine whether the standard of encoded data to be decoded is the same as the standard of the previously-decoded encoded data can be performed with reference to the standard information. When the standard is the same, the encoded data can be decoded using the decoding table used previously, without transferring the decoding table from the mass memory to the decoding table memory. Consequently, it is possible to reduce the processing and power consumption which are otherwise needed for transferring the decoding table of the standard concerned. In the present structure, the processor performs comparison of the standard information, control of the standard information storage unit, and a transfer of the decoding table of the target standard.

A tenth aspect of the present invention provides, in addition to the ninth aspect, the variable length decoding device, wherein the standard information storage unit is composed of a part of the processor.

According to the structure, it is not necessary to install a new storage unit, since a part of memory which the processor possesses is employed as the standard information storage unit.

An eleventh aspect of the present invention provides, in addition to the eighth aspect, the variable length decoding device, wherein the processor compares the target standard with a standard of previously-decoded encoded data, with reference to the standard information stored in the standard information storage unit, thereby generating a comparison result. When the comparison result determines that the target standard of the encoded data is identical with the standard of the previously-decoded encoded data, the variable length decoding unit decodes the encoded data using the decoding table already stored in the decoding table memory. When the comparison result determines that the target standard of the encoded data is not identical with the standard of the previously-decoded encoded data, the variable length decoding unit stores new standard information on the target standard to the standard information storage unit and transfers a decoding table of the target standard from the mass memory to the decoding table memory, and the variable length decoding unit decodes the encoded data using the transferred decoding table.

According to the structure, comparison to determine whether the standard of encoded data to be decoded is the same as the standard of the previously-decoded encoded data can be performed with reference to the standard information. When the standard is the same, the encoded data can be decoded using the decoding table used previously, without transferring the decoding table from the mass memory to the decoding table memory. Consequently, it is possible to reduce the processing and power consumption which are otherwise needed for transferring the decoding table of the standard concerned. In the structure, the processor performs comparison of standard information, and the variable length decoding unit performs the control of the standard information storage unit and the transfer of the decoding table of the target standard.

A twelfth aspect of the present invention provides, in addition to the eighth aspect, the variable length decoding device, wherein the variable length decoding unit compares the target standard with a standard of previously-decoded encoded data, with reference to the standard information stored in the standard information storage unit, thereby generating a comparison result. When the comparison result determines that the target standard of the encoded data is identical with the standard of the previously-decoded encoded data, the variable length decoding unit decodes the encoded data using the decoding table already stored in the decoding table memory. When the comparison result determines that the target standard of the encoded data is not identical with the standard of the previously-decoded encoded data, the variable length decoding unit stores new standard information on the target standard to the standard information storage unit and transfers a decoding table of the target standard from the mass memory to the decoding table memory, and the variable length decoding unit decodes the encoded data using the transferred decoding table.

According to the structure, comparison to determine whether the standard of encoded data to be decoded is the same as the standard of the previously-decoded encoded data can be performed with reference to the standard information. When the standard is the same, the encoded data can be decoded using the decoding table used previously, without transferring the decoding table from the mass memory to the decoding table memory. Consequently, it is possible to reduce the processing and power consumption which are otherwise needed for transferring the decoding table of the standard concerned. In the structure, the variable length decoding unit performs the comparison of the standard information, the control of the standard information storage unit, and the transfer of the decoding table of the target standard.

A thirteenth aspect of the present invention provides, in addition to the twelfth aspect, the variable length decoding device, wherein the standard information storage unit is composed of a part of the variable length decoding unit.

According to the structure, the standard information storage unit can be controlled by the control unit included in the variable length decoding unit.

A fourteenth aspect of the present invention provides, in addition to the twelfth aspect, the variable length decoding device, wherein the variable length decoding unit analyzes a bit stream of the encoded data to specify the target standard on which the encoded data is based.

According to the structure, even when the standard information of encoded data to be decoded is not known, the standard information can be acquired by analyzing the bit stream of the encoded data. With reference to the standard information acquired in this way, it can be judged whether it is necessary to transfer the decoding table from the mass memory to the decoding table memory.

A fifteenth aspect of the present invention provides, in addition to the twelfth aspect, the variable length decoding device, wherein the decoding table memory is composed of a cache memory, and wherein the control unit stores a part of the decoding table of the target standard to the decoding table memory in accordance with a predetermined rule.

A sixteenth aspect of the present invention provides, in addition to the fifteenth aspect, the variable length decoding device, wherein the predetermined rule is defined based on the length of codes included in each table data of the decoding table.

A seventeenth aspect of the present invention provides, in addition to the fifteenth aspect, the variable length decoding device, wherein the predetermined rule is defined based on at least one of a frequency of usage and order of usage for each table data of the decoding table of the target standard in decoding process.

According to these structures, it is possible to realize a high-speed decoding processing by storing the decoding table into a high-speed and small cache memory. Since the cache memory stores only a part of table data of the decoding table, the so-called cache error may happen at the time of decoding. According to these structures, when the cache error occurs, replacement of the table data is performed according to a predetermined rule (for example, in shorter order of the length of code which each table data possesses or in higher order of the frequency of usage that each table data is used in the decoding processing). Consequently, a rational and efficient variable length decoding device can be realized. When decoding again the encoded data decoded in the past, the table data can be replaced in the order used in the past decoding, thereby, occurrence of the cache error can be prevented.

An eighteenth aspect of the present invention provides, in addition to the fifteenth aspect, the variable length decoding device, wherein the variable length decoding unit further comprises a frequency information storage unit operable to store frequency information indicating a frequency of usage that each table data of the decoding table of the target standard is used in decoding process, and wherein the control unit stores the table data of the decoding table into the decoding table memory in a higher order of the frequency of usage, with reference to the frequency information stored in the frequency information storage unit.

According to these structures, the cache memory of high-speed operation is adopted as the decoding table memory, and the table data is stored in the cache memory in the frequently-used order, with reference to the frequency information. Consequently, the probability of occurrence of the cache error in the decoding processing can be reduced. Therefore, the frequency of transfer processing of the decoding table accompanying the occurrence of cache error can be reduced, and improvement in the speed of the decoding processing and reduction of power consumption can be realized.

A nineteenth aspect of the present invention provides, in addition to the eighteenth aspect, the variable length decoding device, wherein the frequency information is stored in linkage with identification information by which the variable-length-decoded encoded data is discerned, and wherein, in decoding new encoded data, the control unit refers to the frequency information linked with identification information of the new encoded data, among a plurality of pieces of frequency information stored in the frequency information storage unit, thereby the control unit stores the table data of the decoding table to the decoding table memory in a higher order of the frequency of usage.

According to the structure, by referring to an identification number in decoding of encoded data, frequently-used table data can be stored in the decoding table memory, using the frequency information of encoded data decoded in the past with the same identification information. Therefore, in reproduction of the same motion picture etc., the probability of occurrence of the cache error in the decoding processing can be reduced, and efficient decoding can be realized.

A twentieth aspect of the present invention provides, in addition to the fifteenth aspect, the variable length decoding device, wherein the variable length decoding unit further comprises an order information storage unit operable to store order information indicating order of usage that each table data of the decoding table of the target standard is used in decoding process, and wherein the control unit stores the table data of the decoding table into the decoding table memory in order of usage, with reference to the order information stored in the order information storage unit.

A twenty-first aspect of the present invention provides, in addition to the twentieth aspect, the variable length decoding device, wherein the order information is stored in linkage with identification information by which the variable-length-decoded encoded data is discerned, and wherein, in decoding new encoded data, the control unit refers to the order information linked with identification information of the new encoded data, among a plurality of pieces of order information stored in the order information storage unit, thereby the control unit stores the table data of the decoding table to the decoding table memory in order of usage.

According to these structures, when new encoded data is decoded, the order that the table data of the decoding table is used is recorded as order information, which is managed then after in linkage with the identification information. When decoding again the encoded data decoded in the past, this feature allows the replacement of the table data to cache memory to be performed in the order which the table data is used in decoding. Therefore, the occurrence of the cache error can be prevented. This demonstrates effect, when viewing and listening to the same moving image repeatedly.

The twenty-second aspect of the present invention provides a semiconductor device operable to perform decoding of encoded data which is variable-length-encoded in conformity with one of a plurality of standards, the semiconductor device comprising: an encoded data memory operable to store the encoded data; a variable length decoding unit operable to decode the encoded data stored in the encoded data memory, thereby generating decoded data; a decoded data memory operable to store the decoded data; and a standard information storage unit operable to store standard information on a target standard on which the encoded data is based. The variable length decoding unit comprises: a control unit operable to control decoding process of the encoded data; and a decoding table memory operable to store a decoding table for the target standard.

According to the structure, it is possible to realize the efficient variable length decoding device which decodes the variable length encoded data based on the various standards by combining the semiconductor device of the present invention with a processor which controls the whole system, and a mass memory possessing the decoding tables of a plurality of standards.

A twenty-third aspect of the present invention provides, in addition to the twenty-second aspect, the semiconductor device further comprising: a processor operable to control the variable length decoding unit.

According to the structure, it is possible to realize the efficient variable length decoding device which decodes the variable length encoded data based on the various standards by combining the semiconductor device of the present invention with the mass memory possessing the decoding tables of a plurality of standards.

A twenty-fourth aspect of the present invention provides, in addition to the twenty-second aspect, the semiconductor device further comprising: a mass memory operable to store a plurality of decoding tables, each of the plurality of decoding tables corresponding to each of the plurality of standards; and a processor operable to control the mass memory and the variable length decoding unit, wherein the processor transfers a decoding table of the target standard from the mass memory to the variable length decoding unit, referring to the standard information.

According to the structure, it is possible to realize the efficient variable length decoding device which decodes the variable length encoded data based on the various standards only with the semiconductor device of the present invention without adding a new external functional element.

A twenty-fifth aspect of the present invention provides, in addition to the twenty-fourth aspect, the semiconductor device, wherein the variable length decoding unit further comprises a frequency information storage unit operable to store frequency information indicating a frequency of usage that each table data of the decoding table of the target standard is used in decoding process, and wherein the control unit stores the table data of the decoding table into the decoding table memory in a higher order of the frequency of usage, with reference to the frequency information stored in the frequency information storage unit.

According to the structure, the cache memory of high-speed operation is adopted as the decoding table memory, and the table data is stored in the cache memory in higher order of the frequency of usage, with reference to the frequency information. Consequently, the probability of occurrence of the cache error in the decoding processing can be reduced. Therefore, the frequency of transfer processing of the decoding table accompanying the occurrence of cache error can be reduced, and the semiconductor device which is characterized by improvement in the speed of a decoding processing and reduction of power consumption can be provided.

The twenty-sixth aspect of the present invention provides an electronic device, comprising: an input interface unit operable to externally input encoded data which is variable-length-encoded in conformity with at least one of a plurality of standards; a variable length decoding device operable to variable-length-decode the encoded data inputted via the input interface unit, thereby generating decoded data; a decoded data processing unit operable to perform signal processing for the decoded data, thereby generating reproduced signals; and an output interface unit operable to feed the reproduced signals outside. The variable length decoding device comprises: a processor; a mass memory operable to store a plurality of decoding tables corresponding to the plurality of standards; an encoded data memory operable to store the encoded data inputted via the input interface unit; a standard information storage unit operable to store standard information on a target standard on which the encoded data is based; a decoding table memory operable to store a decoding table for the target standard with reference to the standard information; a variable length decoding unit operable to variable-length-decode the encoded data stored in the encoded data memory, with reference to the decoding table of the target standard stored in the decoding table memory, thereby generating decoded data; and a decoded data memory operable to store the decoded data, wherein the processor transfers the decoding table of the target standard from the mass memory to the decoding table memory, referring to the standard information.

According to the structure, it is possible to realize the motion picture decoding device which can perform the high-speed decoding of the variable-length-encoded motion picture data, or the music player which can perform the high-speed decoding of the variable-length-encoded music data. These electronic devices have a good replacement efficiency of the decoding table, and are characterized by the feature that power consumption is small. These electronic devices include a camera-equipped mobile phone, a potable music player, etc.

A twenty-seventh aspect of the present invention provides, in addition to the twenty-sixth aspect, the electronic device, wherein the variable length decoding unit further comprises a frequency information storage unit operable to store frequency information indicating a frequency of usage that each table data of the decoding table of the target standard is used in decoding process, and wherein the processor stores the table data of the decoding table into the decoding table memory in a higher order of the frequency of usage, with reference to the frequency information stored in the frequency information storage unit.

According to the structure, the cache memory of high-speed operation is adopted as the decoding table memory, and codes of high frequency of usage can be stored in the cache memory, with reference to the frequency information. Consequently, the probability of occurrence of the cache error in the decoding processing can be reduced. Therefore, the frequency of transfer processing of the decoding table accompanying the occurrence of cache error can be reduced, and the electronic device which is characterized by improvement in the speed of a decoding processing and reduction of power consumption can be provided.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 10($a$) is an exemplification diagram of the management method of the frequency information by the identification number in Embodiment 4 of the present invention;

FIG. 10($b$) is an exemplification diagram of the management method of the frequency information by the identification number in Embodiment 4 of the present invention;

FIG. 10(c) is an exemplification diagram of the management method of the frequency information by the identification number in Embodiment 4 of the present invention;

FIG. 11 is a part of the decoding table in Embodiment 4 of the present invention;

FIG. 12 illustrates an intermediate state of the frequency information in Embodiment 4 of the present invention;

FIG. 13 illustrated a final state of the frequency information in Embodiment 4 of the present invention;

FIG. 14 illustrates an initial state of table data stored in the decoding table memory in Embodiment 4 of the present invention;

FIG. 15 illustrates a state of table data after replacement in the decoding table memory in Embodiment 4 of the present invention;

DETAILED DESCRIPTION OF THE PREFERRED EMBODIMENTS

The following explains preferred embodiments of the present invention referring to the accompanying drawings.

In the following description related to the preferred embodiments of the present invention, encoded data means data generated by encoding a series of motion picture signals, a series of still picture signals, or a series of music signals, according to a certain variable length coding standard, and a bit stream means bit-form data generated by adding encoding-related header data or accompanying data to the encoded data.

Coding standards, such as an MPEG-2 system, an MPEG-4 system, and an H.263 system, are simply called a "standard" in the following description.

Embodiment 1

Figure 1:
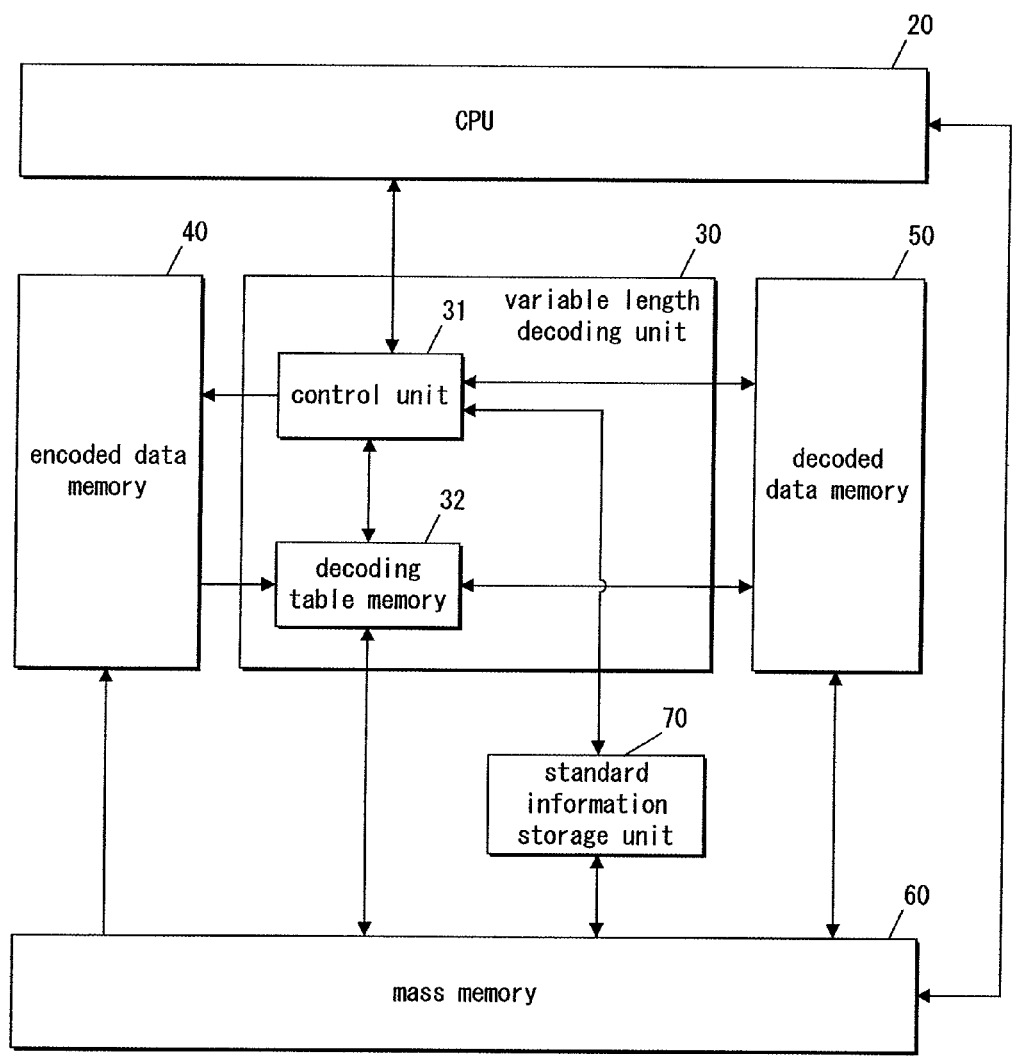
FIG. 1 is a block diagram illustrating a variable length decoding device in Embodiment 1 of the present invention.

FIG. 1 is a block diagram illustrating a variable length decoding device in Embodiment 1 of the present invention. The variable length decoding device of the present embodiment comprises a CPU 20, a variable length decoding unit 30, an encoded data memory 40, a decoded data memory 50, a mass memory 60, and a standard information storage unit 70. The variable length decoding unit 30 comprises a control unit 31 and a decoding table memory 32.

Figure 6:
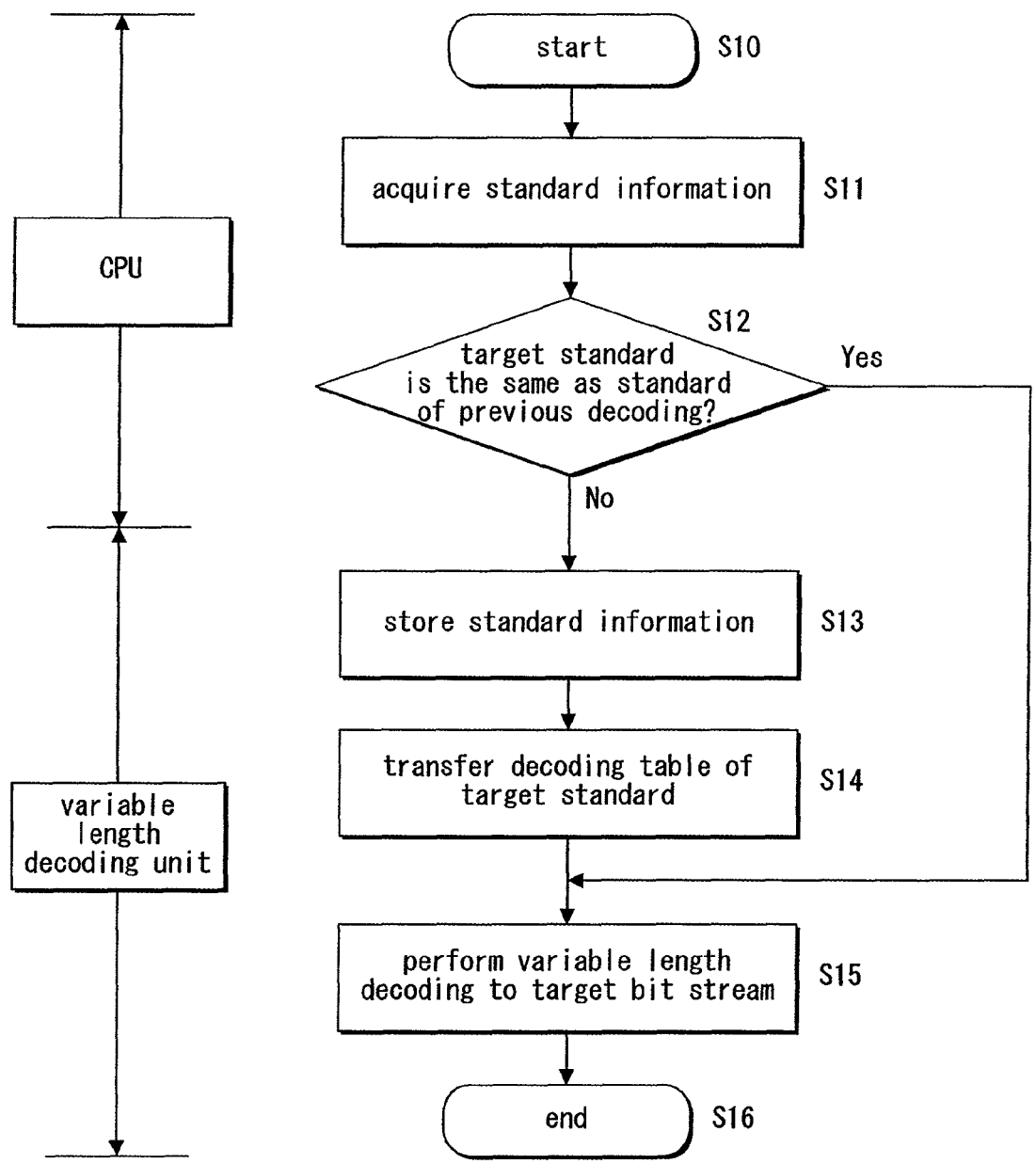
FIG. 6 is a flow chart illustrating a variable length decoding device in Embodiment 1 of the present invention.

Operation of the variable length decoding device of the present embodiment shown in FIG. 1 is explained according to the flow chart shown in FIG. 6. In other words, FIG. 6 is a flow chart illustrating a variable length decoding device in Embodiment 1 of the present invention.

In FIG. 1, the encoded data memory 40 stores a bit stream including encoded data to be decoded. The decoding table memory 32 stores a decoding table of a standard to which the previously-decoded encoded data conforms. The standard information storage unit 70 stores standard information indicating standards to which the encoded data decoded in the past conforms. The mass memory 60 stores a plurality of decoding tables corresponding to various standards.

In the variable length decoding device of the present embodiment, the CPU 20 performs from Step S10 (start) to Step S12 (judgment of a target standard) shown in FIG. 6.

Decoding processing starts at Step S10 shown in FIG. 6.

At Step S11, the CPU 20 acquires standard information indicating a standard to which the encoded data to be decoded conforms (the standard is called a target standard in the following). The standard information is usually attached to the encoded data, and stored in the mass memory 60 with the encoded data.

At Step S12, the CPU 20 compares the acquired standard information and the standard information of the encoded data decoded in the past, which is stored in the standard information storage unit 70. The CPU 20 judges whether the target standard is the same as the standard of the previously-decoded encoded data. The CPU 20 notifies the variable length decoding unit 30 of the judgment result and the standard information indicating the target standard.

When the judgment result at Step S12 is "Yes" (the target standard is the same as the standard of the previously-decoded encoded data), the control unit 31 of the variable length decoding unit 30 moves the control to Step S15. When the judgment result is "No" (it is not the same), the control is moved to Step S13.

At Step S13, the control unit 31 stores the standard information of the target standard, which is notified by the CPU 20, in the standard information storage unit 70.

At Step S14, the control unit 31 transfers the decoding table of the target standard from the mass memory 60 to the decoding table memory 32.

At Step S15, the control unit 31 decodes a bit stream (the bit stream including the encoded data to be decoded) stored in the encoded data memory 40 one after another by using the decoding table stored in the decoding table memory 32, and then stores the decoded data in the decoded data memory 50.

When decoding all bit streams is completed, the control is moved to Step S16, and then the decoding processing ends.

As explained above, the variable length decoding device of the present embodiment acquires standard information of the target standard before decoding, and compares the acquired standard information and the standard information (in other words, the standard information indicating a standard of the encoded data decoded in the past) that is stored in the standard information storage unit 70. When the target standard is judged to be the same as the standard of the previously-decoded encoded data as the comparison result, the decoding is performed using the decoding table that is already stored in the decoding table memory 32 without performing new transfer (it is also called as download) of a decoding table. Conventionally, the transfer of the decoding table was performed in every decoding. However, the variable length decoding device of the present embodiment performs the transfer of the decoding table only when the target standard is different from the standard of the previous decoding. Thus, it is possible to avoid unnecessary transfer processing of the decoding table, thereby reducing the power consumption which is otherwise necessary in the transfer processing.

Embodiment 2

Figure 2:
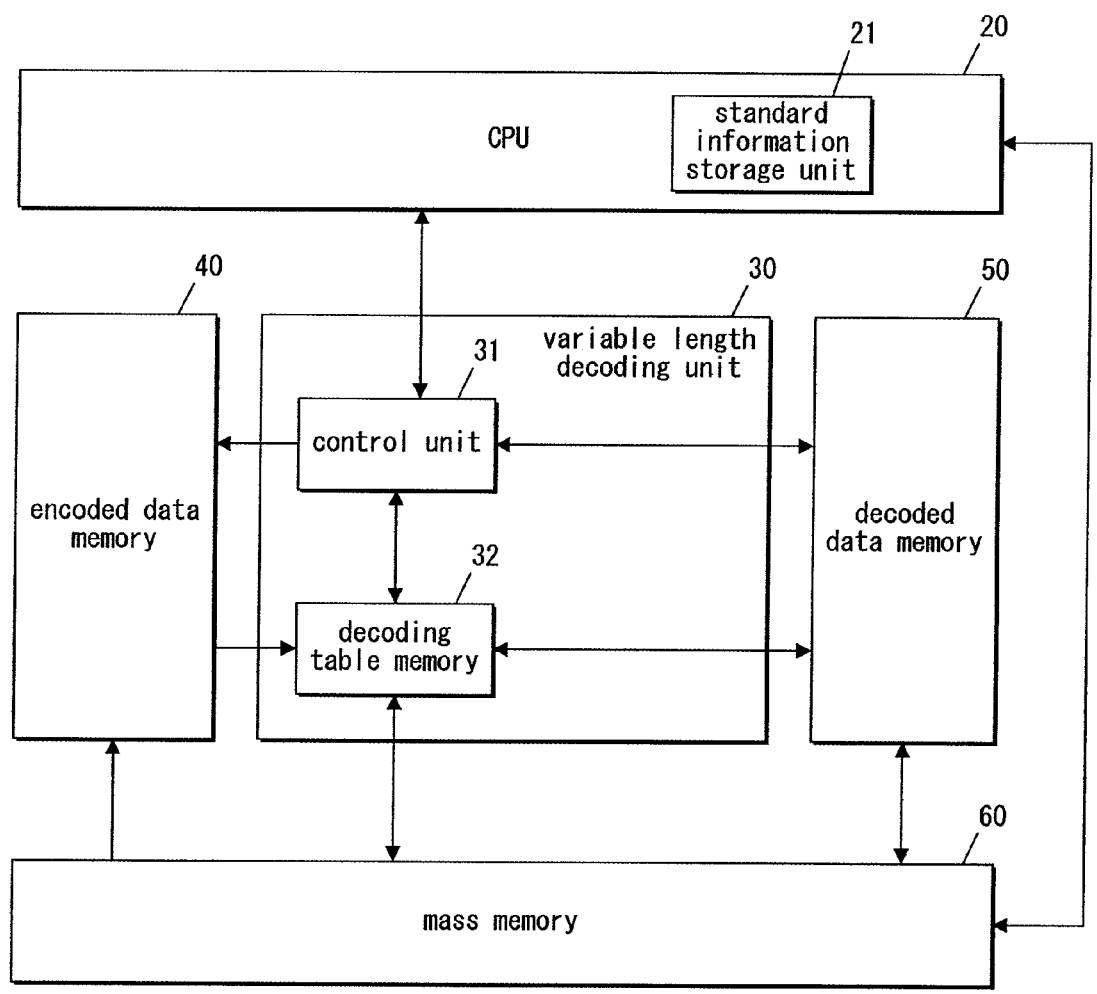
FIG. 2 is a block diagram illustrating a variable length decoding device in Embodiment 2 of the present invention.

FIG. 2 is a block diagram illustrating a variable length decoding device in Embodiment 2 of the present invention. In FIG. 2, the same symbols are given to elements each having the same function as elements of FIG. 1 in order to omit explanation.

The variable length decoding device of the present embodiment comprises a CPU 20, a variable length decoding unit 30, an encoded data memory 40, a decoded data memory 50, and a mass memory 60. The CPU 20 comprises a standard information storage unit 21. The variable length decoding unit 30 comprises a control unit 31 and a decoding table memory 32. In other words, comparing to the variable length decoding device in Embodiment 1 of the present invention shown in FIG. 1, the standard information storage unit 21 is constituted as a part of the CPU 20 in the variable length decoding device of the present embodiment.

Figure 7:
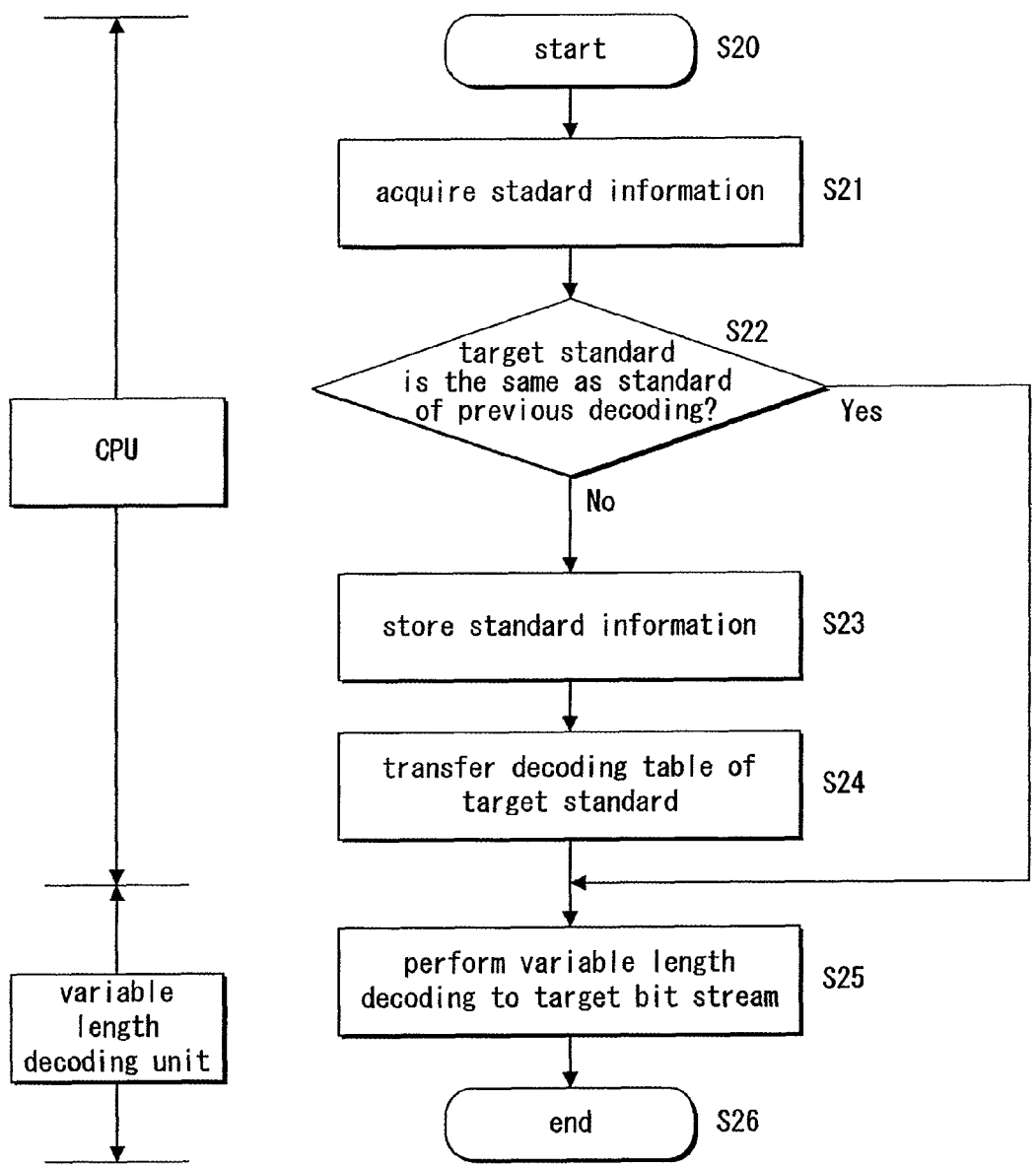
FIG. 7 is a flow chart illustrating a variable length decoding device in Embodiment 2 of the present invention.

The following explains operation of the variable length decoding device of the present embodiment shown in FIG. 2 according to the flow chart shown in FIG. 7. In other words, FIG. 7 is a flow chart illustrating the variable length decoding device in Embodiment 2 of the present invention.

In the variable length decoding device of the present embodiment, the CPU 20 performs from Step S20 (start) to Step S24 (transfer of the decoding table of the target standard) shown in FIG. 7.

Decoding processing starts at Step S20 shown in FIG. 7.

At Step S21, the CPU 20 acquires standard information indicating a standard to which the encoded data to be decoded conforms (or the target standard).

At Step S22, the CPU 20 compares the acquired standard information and the standard information of the encoded data decoded in the past, which is stored in the standard information storage unit 21. The CPU 20 judges whether the target standard is the same as the standard of the previously-decoded encoded data. Processing up to here is similar to the processing of the variable length decoding device in Embodiment 1 of the present invention shown in FIG. 6.

When the judgment result at Step S22 is "Yes" (the target standard is the same as the standard of the previously-decoded encoded data), the CPU 20 moves the control to Step S25. When the judgment result is "No" (it is not the same), the CPU 20 moves the control to Step S23.

At Step S23, the CPU 20 stores the standard information of the acquired target standard in the standard information storage unit 21.

At Step S24, the CPU 20 transfers the decoding table of the target standard from the mass memory 60 to the decoding table memory 32.

At Step S25, the control unit 31 of the variable length decoding unit 30 decodes a bit stream (the bit stream including the encoded data to be decoded) stored in the encoded data memory 40 one after another by using the decoding table stored in the decoding table memory 32, and then stores the decoded data in the decoded data memory 50.

When decoding all bit streams is completed, the control moves to Step S26, and then the decoding processing ends.

Thus, the variable length decoding device of the present embodiment can similarly perform the processing which the variable length decoding device in Embodiment 1 performs, by using a part of the memory possessed by the CPU 20 as the standard information storage unit 21. Therefore, in the variable length decoding device of the present embodiment, the same effect as that of Embodiment 1 of the present invention can be acquired.

The variable length decoding device of the present embodiment is preferred as structure when the CPU 20 has a margin in the throughput thereof. Since it is not necessary to constitute the standard information storage unit 21 as an independent circuit, the variable length decoding device of the present embodiment can be smaller in circuit scale by that much.

Embodiment 3

Figure 3:
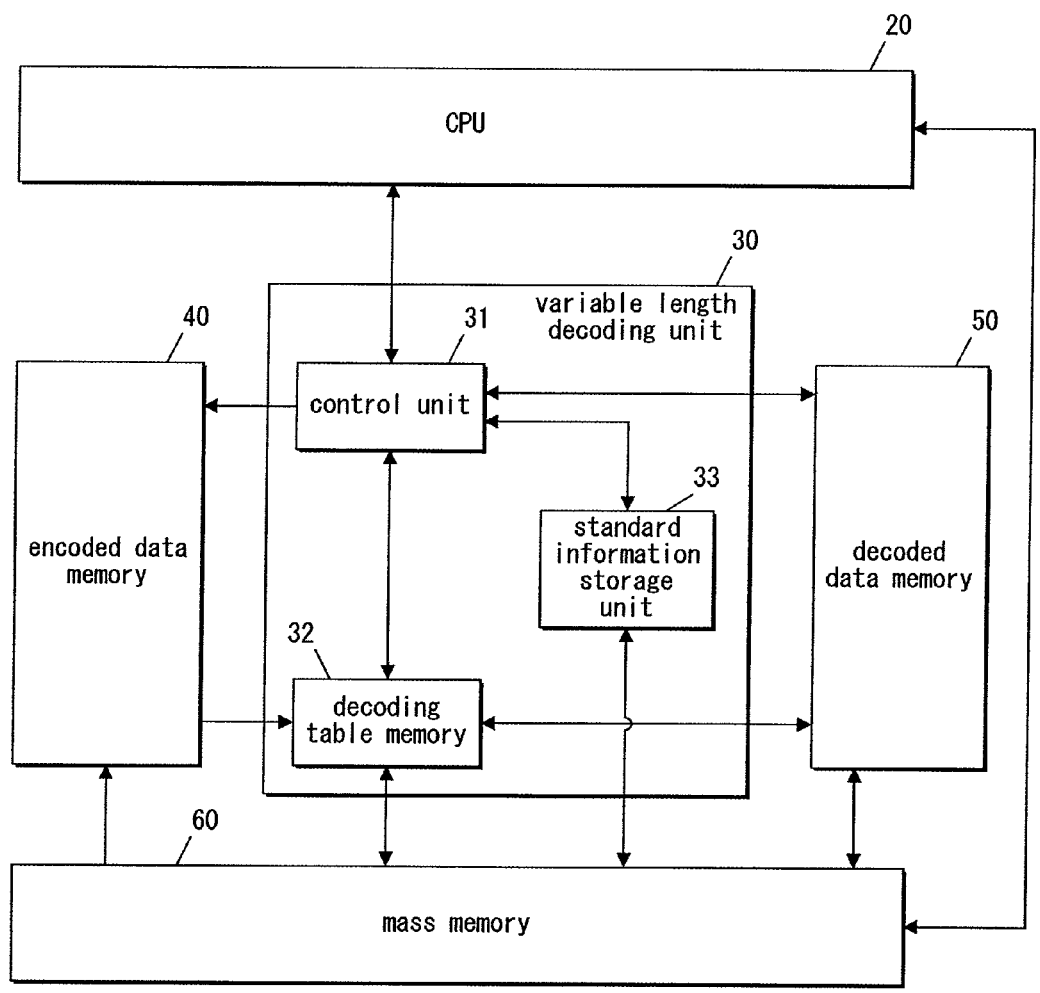
FIG. 3 is a block diagram illustrating a variable length decoding device in Embodiment 3 of the present invention.

FIG. 3 is a block diagram illustrating a variable length decoding device in Embodiment 3 of the present invention. In FIG. 3, the same symbols are given to elements each having the same function as elements of FIG. 1 in order to omit explanation.

The variable length decoding device of the present embodiment comprises a CPU 20, a variable length decoding unit 30, an encoded data memory 40, a decoded data memory 50, and a mass memory 60. The variable length decoding unit 30 comprises a control unit 31, a decoding table memory 32, and a standard information storage unit 33. In other words, comparing to the variable length decoding device in Embodiment 1 of the present invention shown in FIG. 1, the standard information storage unit 33 is constructed inside of the variable length decoding unit 30 in the variable length decoding device of the present embodiment.

Figure 8:
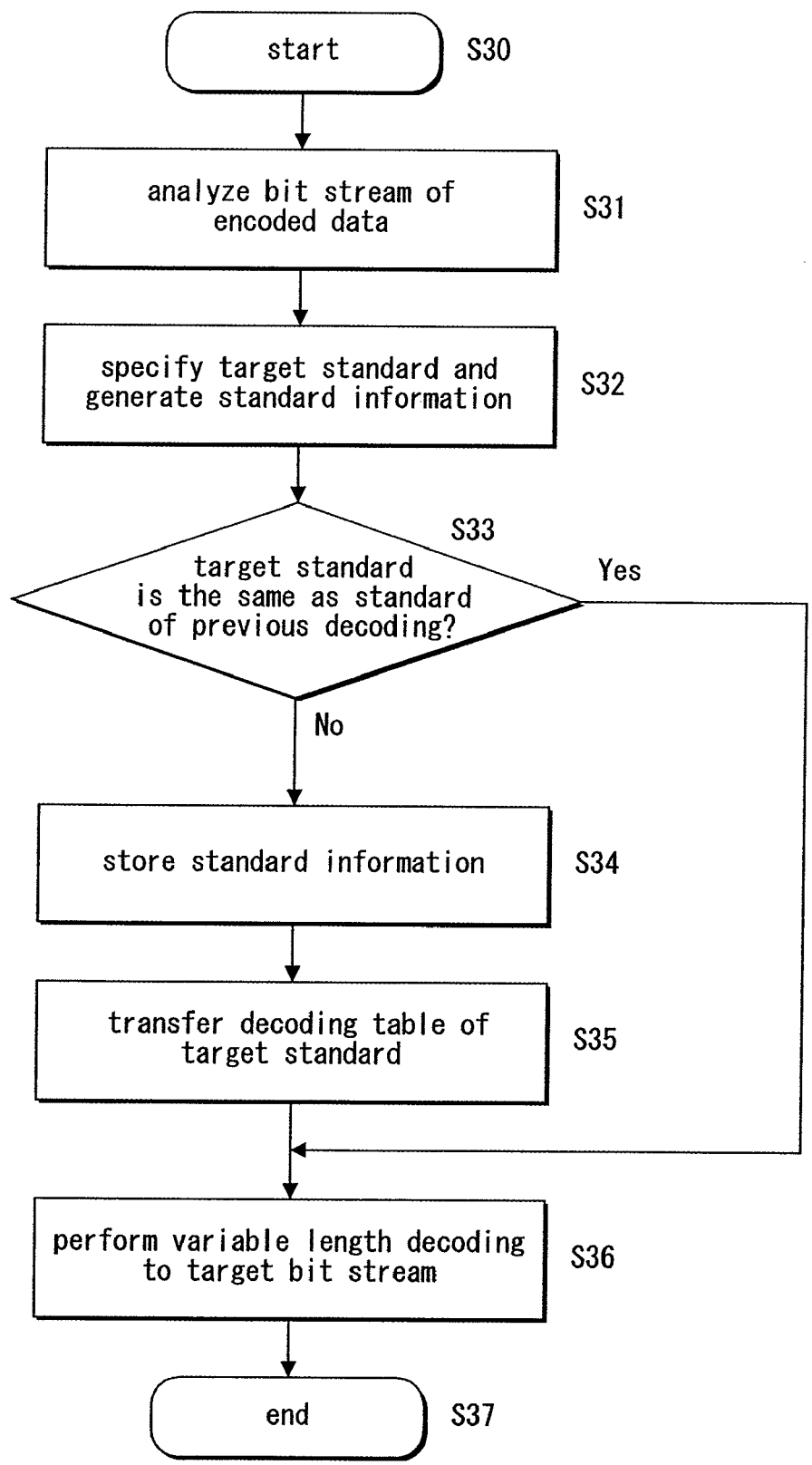
FIG. 8 is a flow chart illustrating a variable length decoding device in Embodiment 3 of the present invention.

The variable length decoding device of the present embodiment shown in FIG. 3 becomes operative especially when standard information can not be acquired before decoding of the encoded data is performed. The following explains the operation of the variable length decoding device of the present embodiment according to the flow chart shown in FIG. 8. In other words, FIG. 8 is a flow chart illustrating the variable length decoding device in Embodiment 3 of the present invention. In FIG. 8, it is assumed that the variable length decoding device can not acquire the standard information before starting decoding processing of the encoded data.

At Step S30 shown in FIG. 8, decoding processing starts.

At Step S31, the control unit 31 analyzes the header of the bit stream including the encoded data to be decoded.

In the analysis of the header, a "start code" is detected and the standard to which the bit stream conforms can be specified. The start code is unique to each standard and is included in the bit stream of the encoded data. For example, bit stream syntax defined by a picture encoding standard of MPEG-4 or H.263 has a hierarchical structure, and the special code called a "start code" is arranged in each hierarchy's head. At the time of decoding bit streams, since the processing is advanced while detecting the start code, the standard to which the encoded data under decoding conforms can be specified during the process of detecting the start code.

At Step S32, the control unit 31 specifies the standard of the encoded data to be decoded (that is, the target standard), through the analysis of the header, and generates standard information of the target standard.

At Step S33, the control unit 31 compares the generated standard information and the standard information of the encoded data decoded in the past that is stored in the standard information storage unit 33, and judges whether the target information is the same as the standard of the previously-decoded encoded data. When the judgment result at Step S33 is "Yes" (the target standard is the same as the standard of the previously-decoded encoded data), the control unit 31 moves the control to Step S36. When the judgment result is "No" (it is not the same), the control is moved to Step S34.

At Step S34, the control unit 31 stores the standard information of the target standard generated at Step S32 into the standard information storage unit 33.

At Step S35, the control unit 31 transfers the decoding table of the target standard from the mass memory 60 to the decoding table memory 32.

At Step S36, the control unit 31 decodes the bit stream including the encoded data stored in the encoded data memory 40 one after another by using the decoding table stored in the decoding table memory 32, and then stores the decoded data in the decoded data memory 50.

When decoding all bit streams is completed, the control moves to Step S37, and then the decoding processing ends.

As explained above, in the variable length decoding device of the present embodiment, when the standard information of the encoded data to be decoded can not be acquired before the decoding processing, the target standard of the encoded data to be decoded can be specified by analyzing the bit stream of the encoded data to be decoded. Then, standard information of the specified target standard can be newly generated. Now, the standard information of the target standard that is generated in this way and the standard information (which is stored in the standard information storage unit 33) indicating the standard of the encoded data decoded in the past are compared. As the result of the comparison, when the target standard and the standard of the previously-decoded encoded data are the same, the variable length decoding unit 30 can perform the decoding by using the decoding table that is already stored in the decoding table memory 32 without newly performing the transfer of the decoding table.

Conventionally, the transfer of the decoding table was performed in every decoding. However, the variable length decoding device of the present embodiment may perform the transfer of the decoding table only when the target standard is different from the standard of the previous decoding. Thus, the variable length decoding unit 30 can avoid unnecessary transfer processing, and can reduce the power consumption which is otherwise necessary in the transfer processing.

Additionally, in the variable length decoding device of the present embodiment, when the standard information of the target standard can be acquired before decoding the encoded data, Step S31 and Step S32 of the flow chart shown in FIG. 8 may be omitted.

Embodiment 4

Figure 4:
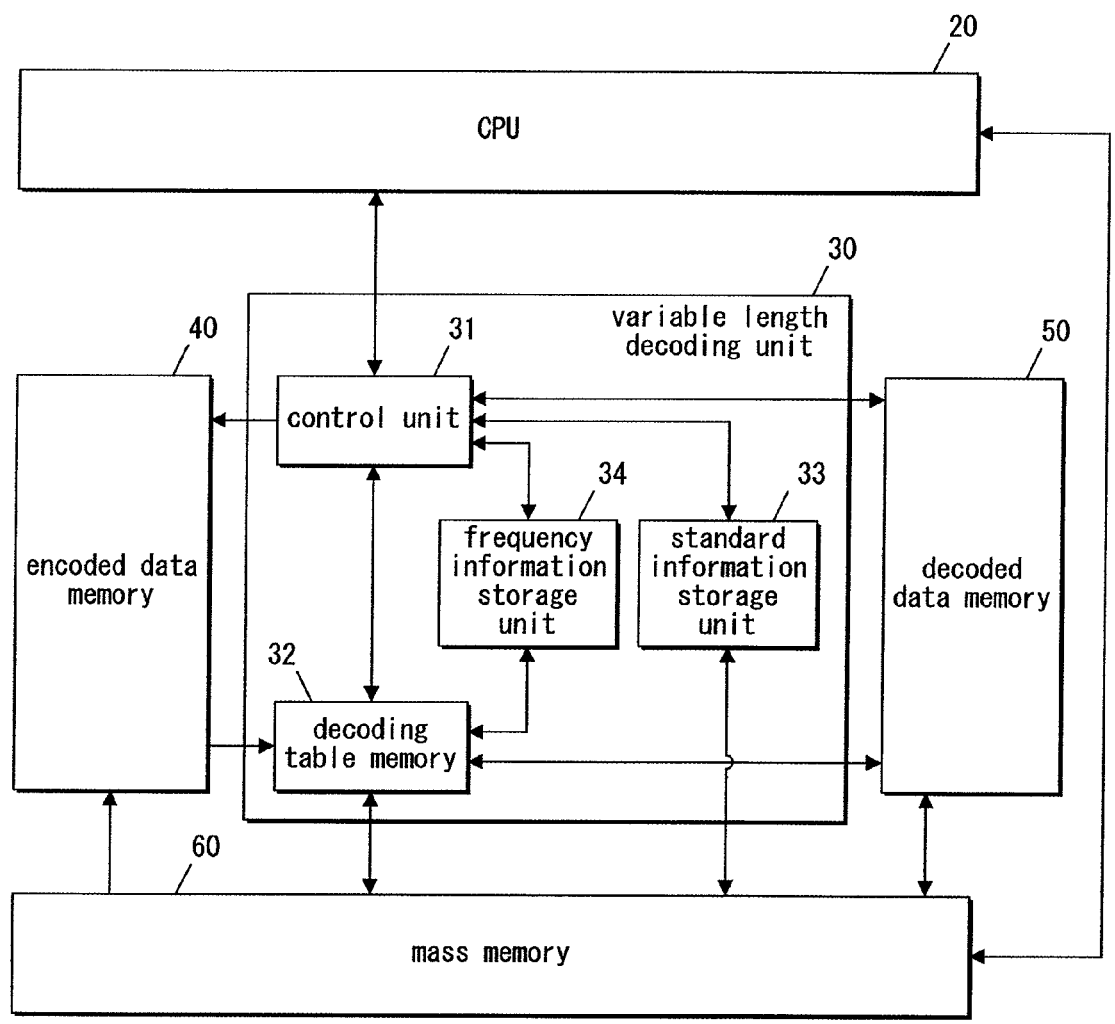
FIG. 4 is a block diagram illustrating a variable length decoding device in Embodiment 4 of the present invention.

FIG. 4 is a block diagram illustrating a variable length decoding device in Embodiment 4 of the present invention. In FIG. 4, the same symbols are given to elements each having the same function as elements of FIG. 3 in order to omit explanation.

In the variable length decoding device of the present embodiment, the variable length decoding unit 30 comprises a frequency information storage unit 34, in addition to the variable length decoding device of Embodiment 3 of the present invention shown in FIG. 3.

The decoding table memory 32 of the present embodiment is composed of a cache memory of a small area, and stores a part of table data of a decoding table.

The frequency information storage unit 34 stores frequency information indicating the frequency of usage for every table data. The frequency of usage for every table data indicates how many times each table data of the decoding table is used at the time when a series of encoded data is decoded. The frequency information is stored after being related to the identification number which is uniquely attached to every encoded data. When a part of table data of the decoding table is stored in the decoding table memory 32, the frequency information is used in order to choose which table data should be stored.

Figure 9:
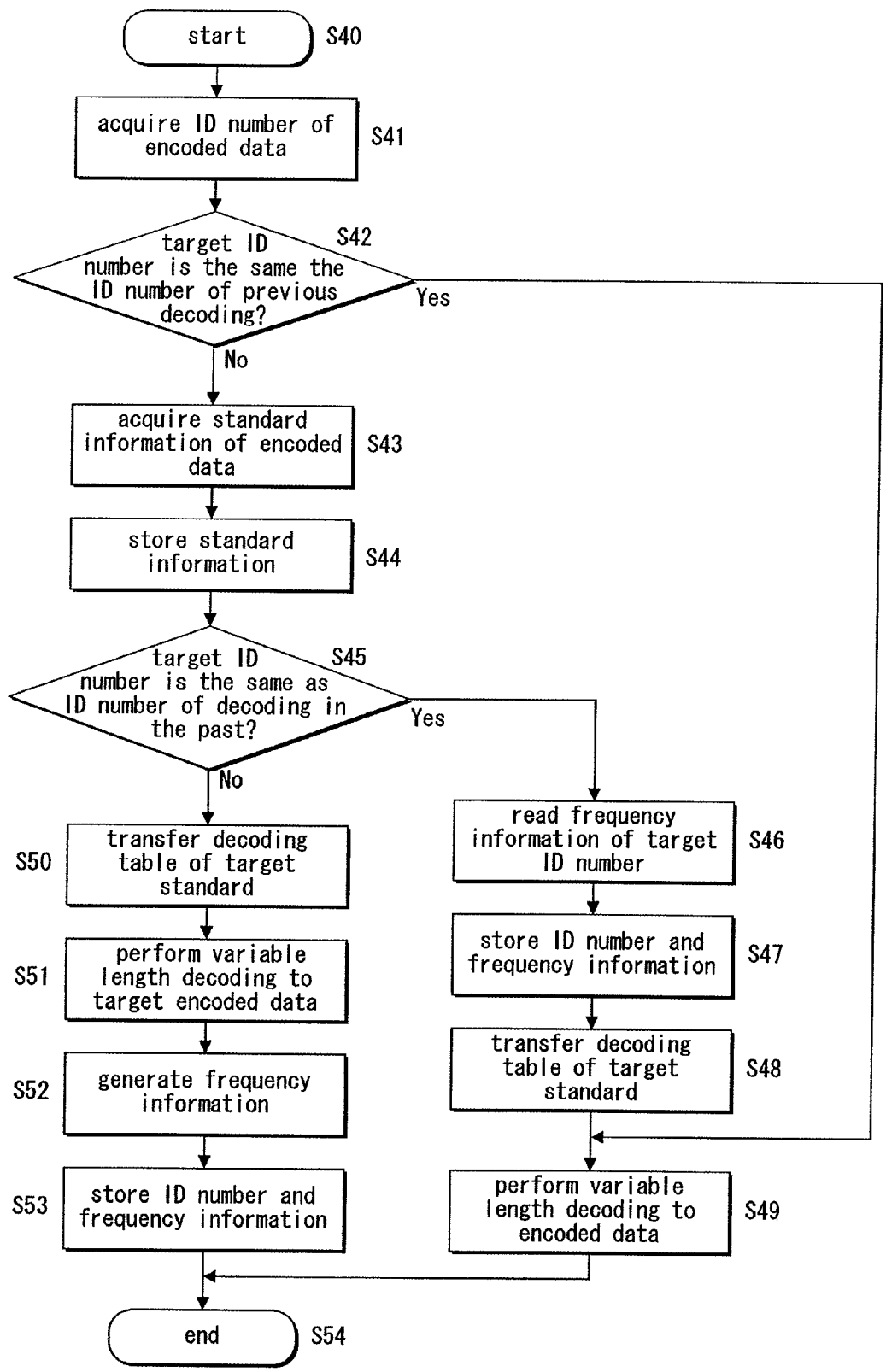
FIG. 9 is a flow chart illustrating a variable length decoding device in Embodiment 4 of the present invention.

The following explains the operation of the variable length decoding device of the present embodiment according to the flow chart shown in FIG. 9. FIG. 9 is a flow chart illustrating the variable length decoding device in Embodiment 4 of the present invention.

At Step S40, decoding processing starts.

At Step S41, the control unit 31 acquires an identification number of the encoded data to be decoded as a target identification number. When the identification number is not allotted to the encoded data to be decoded, a new unique identification number is allotted to the encoded data.

At Step S42, referring to the frequency information storage unit 34, the control unit 31 judges whether the acquired target identification number is the same as the identification number of the previously-decoded encoded data.

When the judgment result at Step S42 is "Yes" (the target identification number is the same as the identification number of the previously-decoded encoded data), the control unit 31 moves the control to Step S49. At Step S49, the control unit 31 reads out the bit stream of the encoded data from the encoded data memory 40. Using the decoding table already stored in the decoding table memory 32 (the same decoding table used at the last decoding), the control unit 31 variable-length-decodes the bit stream, and generates decoded data. The control unit 31 stores the decoded data in the decoded data memory 50, and ends the processing at Step S54.

When the judgment result at Step S42 is "No" (the target identification number is not the same as the identification number of the previously-decoded encoded data), the control unit 31 moves the control to Step S43.

At Step S43, the control unit 31 acquires standard information of the encoded data to be decoded. The standard information is usually attached to the encoded data. When the standard information is not attached to the encoded data, analysis of the bit stream is performed as in Embodiment 3 of the present invention, and identification of the target standard and generation of the standard information are performed (Step S31 and Step S32 that are shown in FIG. 8).

At Step S44, the control unit 31 stores the acquired standard information in the standard information storage unit 33.

At Step S45, referring to the frequency information storage unit 34, the control unit 31 judges whether the target identification number is the same as the identification number of encoded data that has been decoded earlier than the last decoding.

When the judgment result at Step S45 is "Yes" (the target identification number is the same as the identification number of the encoded data that has been decoded earlier than the last decoding), the control unit 31 moves the control to Step S46. When the judgment result is "No" (the target identification number is not the same), the control unit 31 moves the control to Step S50.

At Step S46, the control unit 31 reads out the frequency information that is related to the target identification number from the frequency information storage unit 34.

At Step S47, the control unit 31 relates the read frequency information to the target identification number, and stores the frequency information in the frequency information storage unit 34. The present processing may be performed in a practical sense by only updating the data when the decoding processing is performed using the frequency information concerned.

At Step S48, the control unit 31 transfers a part of table data of the decoding table of the target standard from the mass memory 60 to the decoding table memory 32, according to a predetermined rule. In this case, the predetermined rule is defined based on the frequency information. In other words, referring to the frequency information of the target identification number read out, the table data selected in higher order of the frequency of usage is transferred from the mass memory 60 to the decoding table memory 32. How to use the frequency information is described later in detail.

At Step S49, the control unit 31 reads out a bit stream including the encoded data from the encoded data memory 40. Using the decoding table stored in the decoding table memory 32, the control unit 31 variable-length-decodes the bit stream, and generates decoded data. The control unit 31 stores the decoded data in the decoded data memory 50, and ends the processing at Step S54.

When the judgment result is "No" at Step S45 (the target identification number is not the same as any of the identification numbers of encoded data that have been decoded earlier than the last decoding), the control is moved to Step S50 and the processing from Step S50 to Step S54 is performed.

At Step S50, since the encoded data to be decoded has not been decoded before, the frequency information to be referred to is not stored in the frequency information storage unit 34. In this case, the control unit 31 defines the predetermined rule based on the values of "Run" and "Level." In other words, the control unit 31 selects a part of table data of the decoding table of the target standard in the order of each smaller value of "Run" and "Level," and transfers the table data from the mass memory 60 to the decoding table memory 32.

At Step S51, the control unit 31 reads out a bit stream including the encoded data from the encoded data memory 40. Using the decoding table stored in the decoding table memory 32, the control unit 31 variable-length-decodes the bit stream, and generates decoded data. The control unit 31 stores the decoded data in the decoded data memory 50.

At Step S52, in the decoding processing performed at Step S51, the control unit 31 totals up the frequency of usage that each table data is used, and generates new frequency information.

At Step S53, the control unit 31 relates the newly generated frequency information to the target identification number, stores the frequency information in the frequency information storage unit 34, and ends the processing at Step S54.

FIG. 10 is an exemplification diagram of the management method of the frequency information by the identification number in Embodiment 4 of the present invention. As shown in FIG. 10(a), in the management method of the frequency information by the identification number of the present embodiment, the encoded data decoded in the past is registered in terms of identification numbers "ID001," "ID002," and "ID003." These identification numbers are related to the respective frequency information numbers, standards, and decoding process time, and are stored in the frequency information storage unit 34 in chronological order of the decoding process time.

Now, a case is explained where a motion picture having the encoded data of the identification number "ID003" is reproduced again. In the frequency information storage unit 34, the entry of the identification number "ID003" has the latest decoding process time, and is stored in the uppermost row. Therefore, the control unit 31 judges that the encoded data of the present motion picture is the same as the encoded data which has been decoded previously, and decodes the encoded data using the decoding table that is already stored in the decoding table memory 32.

Thus, when decoding the previously-decoded encoded data, since transferring the decoding table newly is not necessary, it is possible to improve processing efficiency and power saving.

Next, the following explains a case where a motion picture having the encoded data of the identification number "ID001" is reproduced again some day later. Referring to FIG. 10(a), the control unit 31 judges that the encoded data of the present motion picture is the same as the encoded data that has been decoded in the past and earlier than the last decoding. Based on the frequency information of a frequency information number "INFO-1" related to the identification number "ID001," the control unit 31 transfers a part of the table data from the mass memory 60 to the decoding table memory 32 in higher order of the frequency of usage. Then, the control unit 31 decodes the encoded data using the decoding table stored in the decoding table memory 32. After the decoding processing is completed, the control unit 31 updates the decoding process time of the identification number "ID001" as shown in FIG. 10(b).

Thus, when decoding encoded data for which decoding is performed in the past and the identification number thereof is already registered, a suitable part of the table data for decoding the encoded data can be transferred to the decoding table memory 32 using the corresponding frequency information; thereby, it is possible to realize efficient decoding processing.

The following explains a case where a motion picture having the encoded data not registered in the frequency information storage unit 34 is reproduced. As shown in FIG. 10(c), the control unit 31 allots a new identification number "ID004" to the encoded data, acquires the standard to which the encoded data conforms, stores a part of the table data of the decoding table for the standard in the decoding table memory 32, and decodes the encoded data. After the decoding is completed, the frequency information of a frequency information number "INFO-4" is generated, and is stored in the frequency information storage unit 34 as well as an identification number "ID004." The frequency information will be used when the encoded data of the identification number "ID004" will be decoded again.

As mentioned above, since the variable length decoding device of the present embodiment uses a high-speed small-area cache memory as the decoding table memory 32, the decoding table memory 32 can not store the entire decoding table for the standard concerned. Therefore, in process of decoding, the table data of the decoding table that matches the encoded data to be decoded may not be found in the decoding table memory 32 (this situation is generally called as a cache error). In this case, it is necessary to replace a part of the decoding table that is stored in the decoding table memory 32. The following explains a replacement method using frequency information.

FIG. 11 shows a part of the decoding table in Embodiment 4 of the present invention. FIG. 11 shows hexadecimal addresses of the mass memory 60, where the table data of the decoding table is stored. The address data corresponds to the part of "LAST=0" of the encoded data, specified by the standard of the H.263. The vertical axis of FIG. 11 is a number of "Run," and the horizontal axis is a value of "Level."

FIG. 14 illustrates an initial state of table data stored in the decoding table memory 32 in Embodiment 4 of the present invention. The decoding table memory 32 of the present embodiment is a cache memory whose address space possesses 20 addresses from an address "0" to an address "13" in hexadecimal notation, as shown in FIG. 14. In the addresses of the decoding table memory 32, 20 pieces of table data of the mass memory 60 at the addresses indicated by a solid line frame 105 in FIG. 11 are transferred as initial values.

The table data is data that the values of "Run" and "Level" are stored, as related to the variable length code. For example, table data "R_0, L_1" of the address "0" shown in FIG. 14 is related to a variable length code "10s" ("s" expresses the sign of "Level"). Moreover, table data "R_0, L_2" of the address "1" is related to a variable length code "1111s."

Using the decoding table shown in FIG. 14, the control unit 31 performs decoding, and then records accumulatively the number of times that each table data is used as frequency of usage.

FIG. 12 illustrates an intermediate state of the frequency information in Embodiment 4 of the present invention. FIG. 12 indicates, in relation to the address on the mass memory 60 shown in FIG. 11, the number of times that each table data of FIG. 14 is used during certain encoded data is decoded up to the intermediate stage. The table data of FIG. 14 is what is transferred to the decoding table memory 32. Each value within the solid line frame 120 of FIG. 12 is the frequency of usage of each table data stored in the decoding table memory 32 shown in FIG. 14. For example, the table data "R_0, L_1" is used 10 times and the table data "R_0, L_2" is used 6 times, as shown in the solid line frame 120 of FIG. 12.

The following explains processing for a case where table data of the decoding table corresponding to a part of a bit stream to be decoded is not found in the decoding table memory 32 in process of decoding.

For example, when decoding a part of bit stream "0001 1100s", the table data "R_13, L_1" related to this bit stream is not stored in the decoding table memory 32 as shown in FIG. 14. In other words, a cache error occurs.

The control unit 31 replaces a part of the table data stored in the decoding table memory 32 with 5 pieces of table data at the addresses of the mass memory 60 shown by a dashed line frame 110 of FIG. 11. At this time, referring to the frequency information shown in FIG. 12, the control unit 31 selects 5 pieces of table data in less-frequently-used order out of the table data stored in the decoding table memory 32, and replaces them with 5 pieces of table data having the addresses of the mass memory 60, encompassed by the dashed line frame 110 of FIG. 11.

FIG. 15 illustrates a state of the table data after replacement in the decoding table memory 32 in Embodiment 4 of the present invention. The remarks column is provided in FIG. 15 for convenience' sake in explanation. A mark "replaced" in the remarks column indicates a replaced table data. In this example, since the table data "R_13, L_1" related to the bit stream "0001 1100s" to be decoded is transferred to the address "11" of the decoding table memory 32 by a single replacement, the cache error is dissolved; and the control unit 31 continues the decoding and collects the frequency information.

When another cache error arises, 5 pieces of table data starting from the next address of the mass memory 60 (5 pieces of table data, from "R_15, L_1" to "R_19, L_1" of FIG. 11) are selected to replace 5 pieces of table data of the decoding table memory 32 in less-frequently-used order. The same replacement operation is repeated until the corresponding table data is stored in the decoding table memory 32.

FIG. 13 illustrated a final state of the frequency information in Embodiment 4 of the present invention. FIG. 13 indicates the frequency of usage of each table data at the final stage when decoding of a series of encoded data is completed after the cache error processing is performed several times. The frequency information is stored in the frequency information storage unit 34 as the identification number "ID004" and the frequency information number "INFO-4," for example, as shown in FIG. 10(c). The frequency information is used when the same encoded data is decoded next time. In the next time decoding, 20 pieces of table data, each surrounded by a solid line frame 130 shown in FIG. 13, are transferred from the mass memory 60 to the decoding table memory 32 as initial values.

Note that the 20 pieces of table data having higher frequency of usage (table data surrounded by the solid line frames 130) and the initial 20 pieces of table data (table data surrounded by the solid line frame 100 of FIG. 11), which are selected based on the code length, are very different from each other. This means that the cache error in decoding table memory 32 is considerably reduced by using the 20 pieces of table data having higher frequency of usage instead of the initial 20 pieces of table data. Moreover, it is needless to say that the frequency information differs depending on encoded data to be decoded, and hence, motion pictures to be reproduced.

As explained above, since the cache memory is used as the decoding table memory 32 in the variable length decoding device of the present embodiment, only a part of table data of the decoding table can be stored. For this reason, the variable length decoding device of the present embodiment comprises the frequency information storage unit 34, manages the frequency of usage of each table data as the frequency information, and stores the table data having higher frequency of usage in the decoding table memory 32, thereby reducing the number of occurrence of cache errors. Therefore, the necessary number of times is reduced in the replacement processing of the table data to cope with the occurrence of cache errors; thereby, it is possible to realize an efficient and less-power-consuming decoding processing.

In the variable length decoding device of the present embodiment, a small-area cache memory is adapted as the decoding table memory 32; therefore, the variable length decoding device can be downsized.

In the variable length decoding device of the present embodiment, each encoded data is managed by the identification number, and the frequency information of the decoding table, which each encoded data uses at the time of decoding, is stored as related to the identification number. Therefore, the encoded data of the same identification number can undergo the efficient decoding with less chance of occurrence of cache errors by reading and using the frequency information. This fact means that it is possible to provide an efficient variable length decoding device, in a usage method such that the same motion picture is repeatedly reproduced, or that the same motion picture is reproduced many times in different days.

In the variable length decoding device of the present embodiment, it is assumed that the decoding table memory 32 is composed of a cache memory having 20 pieces of address space. The address space of the cache memory is adjustable according to necessity.

Moreover, in the variable length decoding device of the present embodiment, the replacement of the table data of the decoding table memory 32 is performed by the unit of five pieces, the number of the table data replaced at one time may be decided arbitrarily.

Embodiment 5

Figure 5:
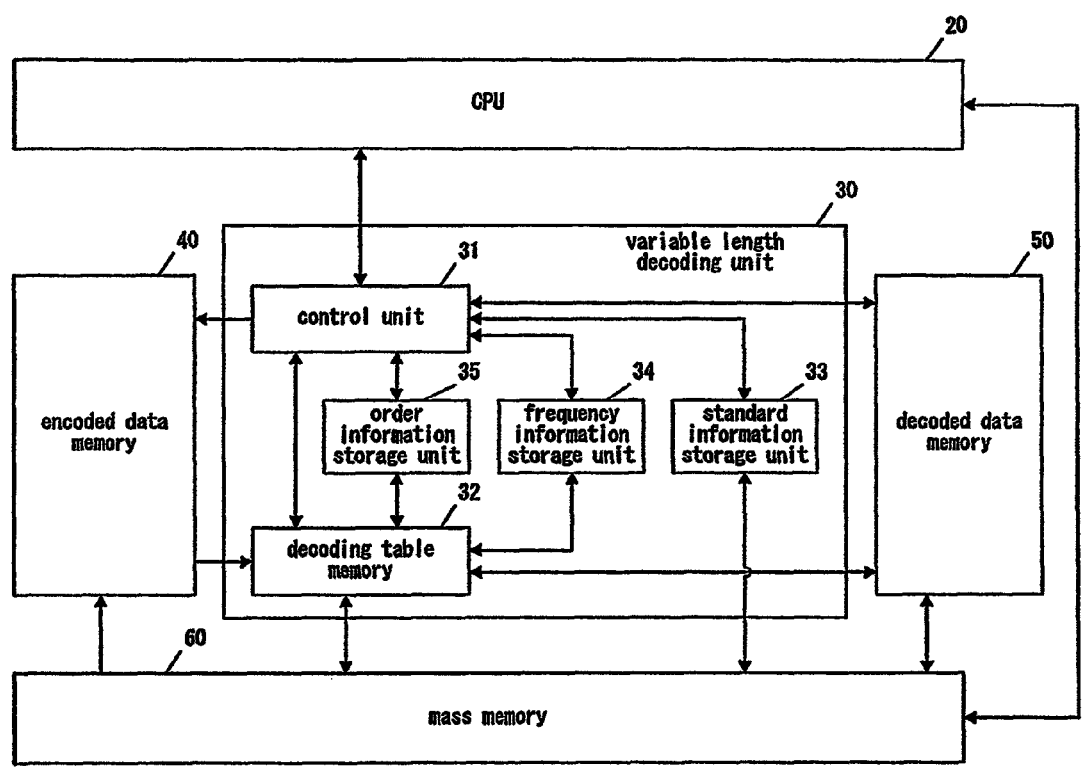
FIG. 5 is a block diagram illustrating a variable length decoding device in Embodiment 5 of the present invention.

FIG. 5 is a block diagram illustrating a variable length decoding device in Embodiment 5 of the present invention. In FIG. 5, the same symbols are given to elements each having the same function as elements of FIG. 4 in order to omit explanation.

In the variable length decoding device of the present embodiment, the variable length decoding unit 30 further possesses an order information storage unit 35, in addition to the variable length decoding device of Embodiment 4 of the present invention shown in FIG. 4. When a series of encoded data is decoded, the order information storage unit 35 acquires, as order information, the order of usage that the table data of the decoding table is used. The order information storage unit 35 stores the order information linked with the identification number.

The following explains operation of the variable length decoding device of the present embodiment.

Similar to Embodiment 4 of the present invention, it is assumed that the decoding table memory 32 shown in FIG. 5 is composed by a cache memory which possesses 20 addresses as shown in FIG. 14.

First, assume a case where a series of encoded data is decoded for the first time, in order to reproduce a certain motion picture for the first time.

When decoding the encoded data of the certain motion picture for the first time, 20 pieces of table data is stored into the decoding table memory 32 from the decoding table of the standard to which the encoded data conforms, according to a predetermined rule. Since the decoding of the encoded data is for the first time, neither frequency information nor order information exists. In this case, the control unit 31 defines the predetermined rule based on the values of "Run" and "Level." In other words, the control unit 31 selects table data of the decoding table, in order of the smaller values of "Run" and "Level," and transfers the table data from the mass memory 60 to the decoding table memory 32. Then, the control unit 31 starts decoding.

When the decoding starts, the control unit 31 records the order of the table data used for the decoding in the order information storage unit 35 as order information. When a cache error occurs in process of the decoding, the control unit 31 transfers table data of which the values of "Run" and "Level" are the smallest next, from the mass memory 60 to the decoding table memory 32, and substitutes the transferred table data for the stored table data of which the values of "Run" and "Level" are the greatest among the table data that is stored in the decoding table memory 32 and not used.

The decoding processing is performed by repeating this operation every time when the cache error occurs. Finally, 20 pieces of table data, which are used at least once, is stored in the decoding table memory 32.

Now, express the table data stored in the decoding table memory 32 as symbols "A", "B", and "C" . . . . Assume that the order of the table data used from the start of decoding is:

"ABCDE FGADH IJABK ACBLM NODPQ RST . . . ."

(The space between symbols is intentionally inserted for reader's convenience, and is not a part of table data.)

In the present example, table data A, B, C, and D are used several times, and each of the other table data is used once. As a result, in 28 times of decoding processing, 20 different pieces of table data are stored in the decoding table memory 32, as follows:

"ABCDE FGHIJ KLMNO PQRST".

Which address of the decoding table memory 32 shown in FIG. 15 stores the above table data is not a problem.

When all of the 20 pieces of table data stored in the decoding table memory 32 are used at least once, the control unit 31 stores the order that each table data is used for the first time in the order information storage unit 35 as order information. Then, the control unit 31 replaces the table data of the decoding table memory 32 with new 20 pieces of table data.

Similarly in the subsequent decoding, the order information is recorded for every 20 pieces of table data as one unit. The order information is stored in the order information storage unit 35 linked with the identification number of the encoded data which has been decoded.

Next, assume a case where the encoded data of the same motion picture is decoded another day. The following explains operation of the variable length decoding device of the present embodiment in the case.

Referring to the identification number of the encoded data, the control unit 31 reads out, from the order information storage unit 35, the order information that was generated at the time of decoding in the past, and transfers every 20 pieces of the table data from the mass memory 60 to the decoding table memory 32 according to the order information. In other words, in this case, the predetermined rule to be used at the transfer of the table data is based on the order information.

As a result, a cache error does not occur in decoding of the encoded data. Therefore, a transfer of the table data accompanying the occurrence of a cache error is unnecessary, leading to efficiently decoding with low power consumption.

When decoding the encoded data of the same motion picture again, it is not necessary to generate new order information.

It is also very useful to co-use the above-mentioned order information and the frequency information at the same time. For example, when the above-mentioned encoded data is decoded for the first time, the table data is used in the order of:

"ABCDE FGADH IJABK ACBLM NODPQ RST . . . . "

In the 28 times of the decoding processing, table data A is used 4 times, table data B is used 3 times, table data C is used twice, table data D is used 3 times, and each of the other table data is used once. Along with the generation of the above-mentioned order information, the control unit 31 records the frequency of usage of each encoded data in the frequency information recording unit 34 as frequency information.

When replacing the table data of the decoding table memory 32 per 20 pieces, the control unit 31 selects the table data in high order of the frequency of usage referring to the frequency information, and transfers the selected table data from the mass memory 60 to the decoding table memory 32.

As a result, it is possible to reduce the probability of occurrence of a cache error after replacing table data per 20 pieces.

When decoding the same encoded data again, the control unit 31 can transfer the suitable table data from the mass memory 60 to the decoding table memory 32 using the order information alone.

The following explains another example of co-use of the order information and the frequency information.

The disadvantage of recording the order information is that the amount of the order information is large. For this reason, in decoding processing of the encoded data of a long motion picture, a large memory is necessary in order to store all of the order information. When decoding the encoded data of the long motion picture, the replacement of the table data is practiced by using the order information in the beginning part of the decoding processing and then the frequency information from the middle of the decoding processing. As a result, in another decoding processing of the encoded data of the long motion picture, a cache error does not occur in the beginning part where the order information is used. In addition, it is possible to suppress the amount of the order information to be stored within a suitable value.

The variable length decoding device of the present embodiment is especially effective in a case where the same motion picture is repeatedly decoded and reproduced.

Embodiment 6

Figure 16:
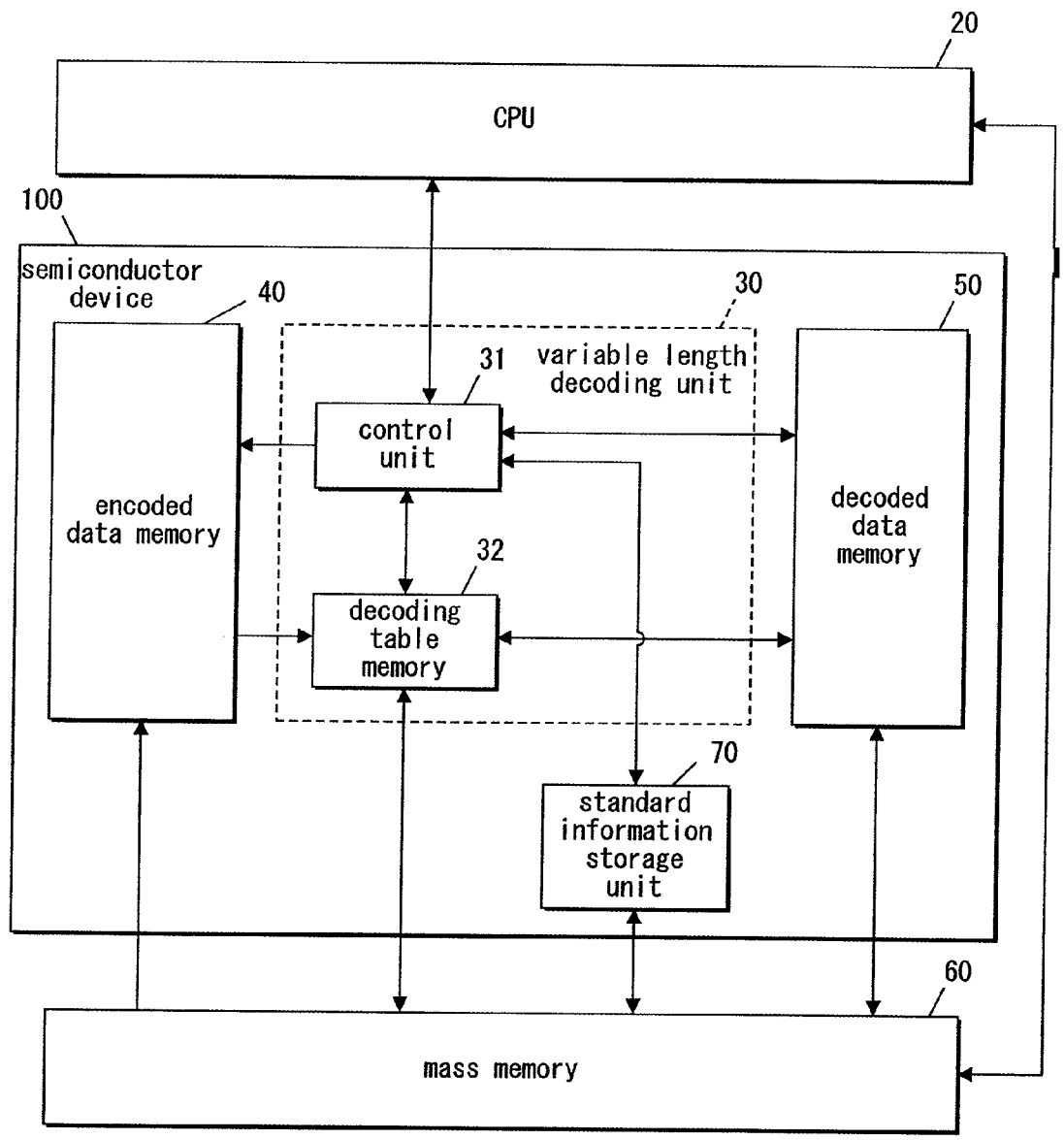
FIG. 16 is a block diagram illustrating a semiconductor device in Embodiment 6 of the present invention, and a connection diagram with an external CPU and an external mass memory.

FIG. 16 is a block diagram illustrating a semiconductor device in Embodiment 6 of the present invention, and a connection diagram with an external CPU and an external mass memory.

As shown in FIG. 16, the semiconductor device 100 of the present embodiment comprises a variable length decoding unit 30, an encoded data memory 40, a decoded data memory 50, and a standard information storage unit 70. The variable length decoding unit 30 comprises a control unit 31 and a decoding table memory 32.

As shown in FIG. 16, the semiconductor device 100 of the present embodiment can realize the variable length decoding device of Embodiment 1 of the present invention shown in FIG. 1, by connecting an external CPU 20 and an external mass memory 60 thereto.

The variable length decoding device, which is realized by connecting the external CPU 20 and the external mass memory 60 to the semiconductor device 100 of the present embodiment, possesses the same function as the variable length decoding device of Embodiment 1 of the present invention shown in FIG. 1. Since the operation is the same as that of the variable length decoding device of Embodiment 1 of the present invention shown in FIG. 1, the explanation thereof is omitted.

Figure 17:
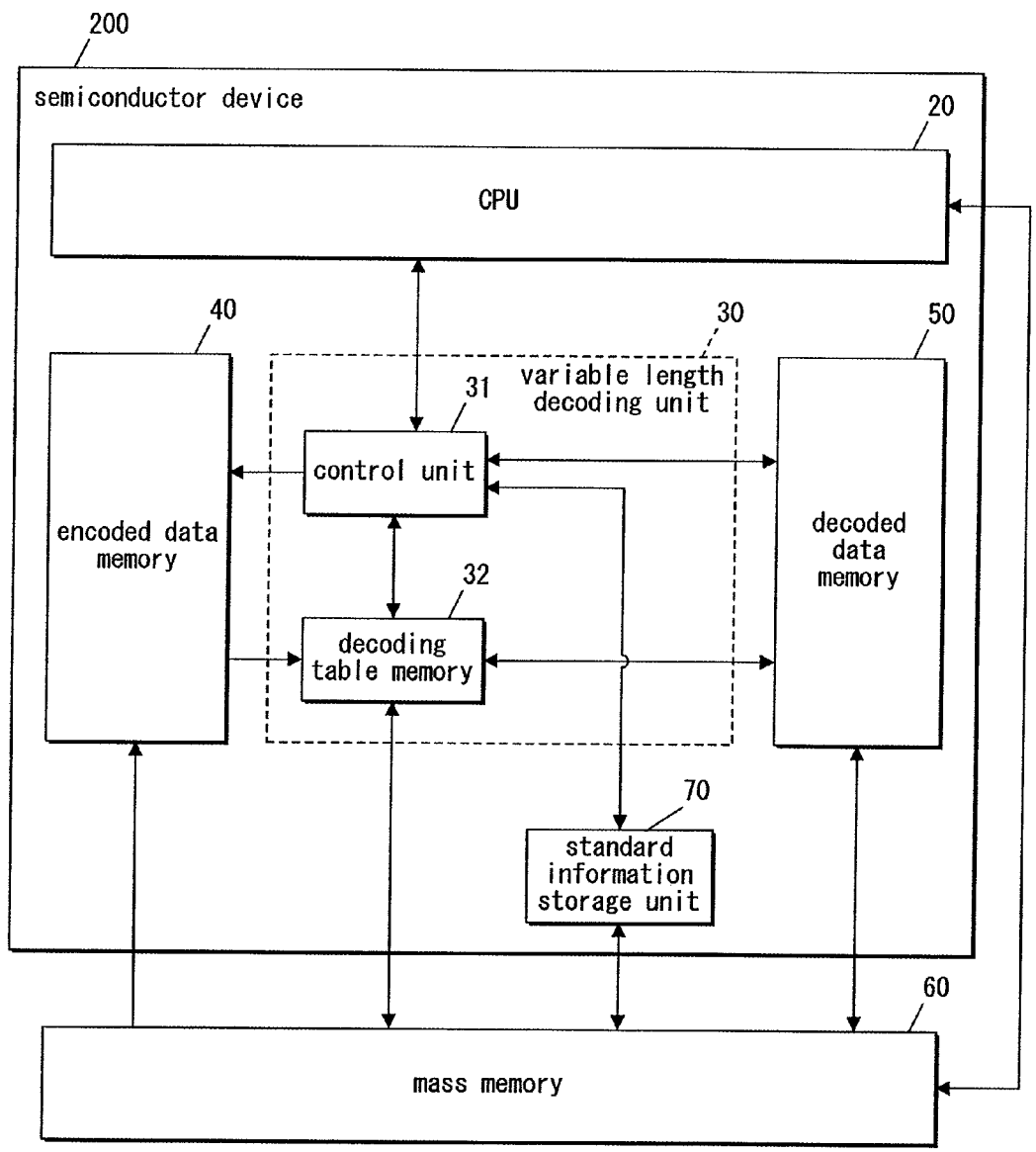
FIG. 17 is a block diagram illustrating a semiconductor device in Embodiment 6 of the present invention, and a connection diagram with an external mass memory.

FIG. 17 is a block diagram illustrating another semiconductor device in Embodiment 6 of the present invention, and a connection diagram with an external mass memory.

As shown in FIG. 17, a semiconductor device 200 of the present embodiment comprises a variable length decoding unit 30, an encoded data memory 40, a decoded data memory 50, a standard information storage unit 70, and a CPU 20. The variable length decoding unit 30 comprises a control unit 31 and a decoding table memory 32.

As shown in FIG. 17, the semiconductor device 200 of the present embodiment can realize the variable length decoding device of Embodiment 1 of the present invention shown in FIG. 1, by connecting an external mass memory 60 thereto.

The variable length decoding device, which is realized by connecting the external mass memory 60 thereto, possesses the same function as the variable length decoding device of Embodiment 1 of the present invention shown in FIG. 1. Since the operation is the same as that of the variable length decoding device of Embodiment 1 of the present invention shown in FIG. 1, the explanation thereof is omitted.

Figure 18:
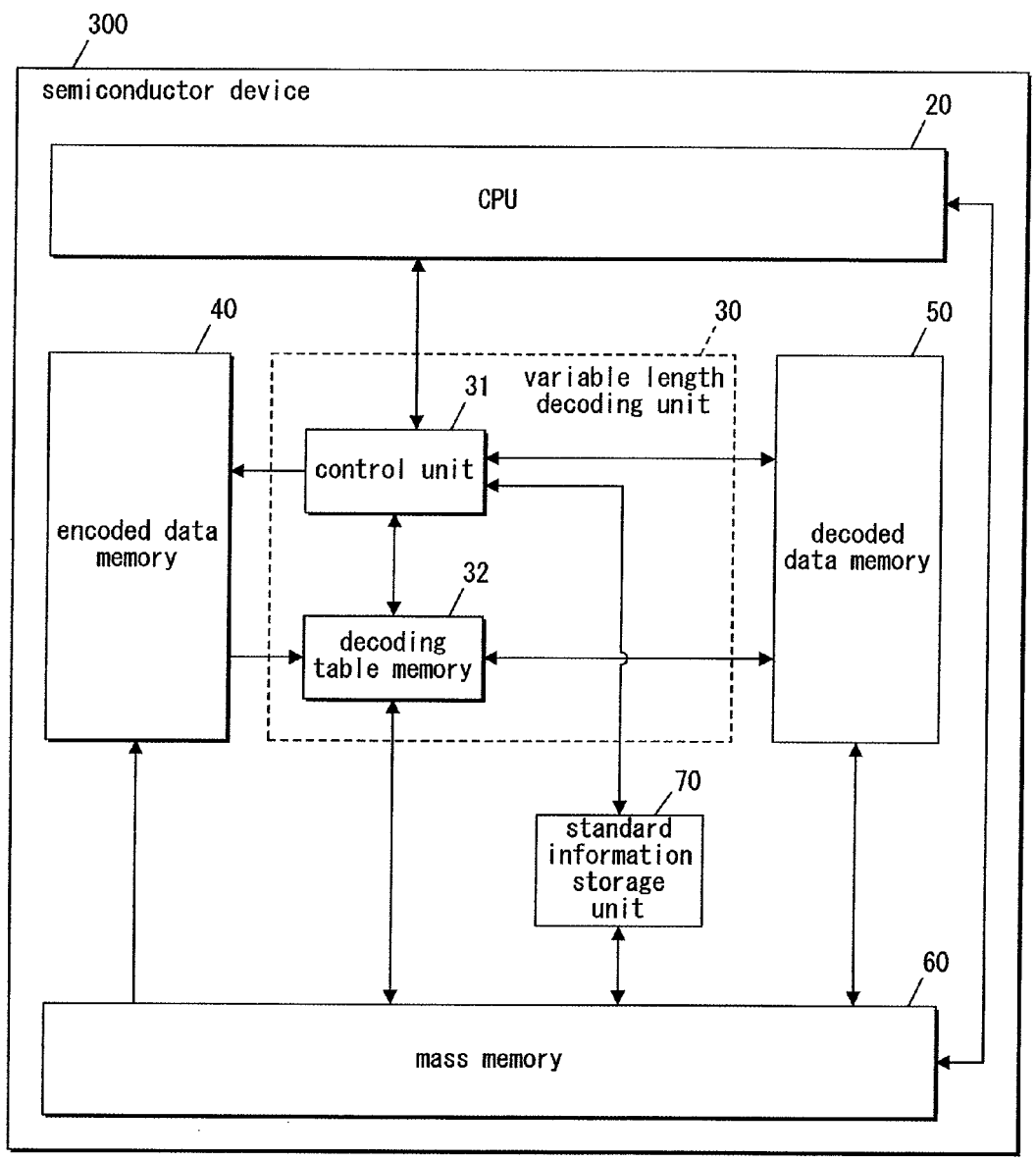
FIG. 18 is a block diagram illustrating a semiconductor device in Embodiment 6 of the present invention.

FIG. 18 is a block diagram illustrating yet another semiconductor device in Embodiment 6 of the present invention.

As shown in FIG. 18, a semiconductor device 300 of the present embodiment comprises a variable length decoding unit 30, an encoded data memory 40, a decoded data memory 50, a standard information storage unit 70, a CPU 20, and a mass memory 60. The variable length decoding unit 30 comprises a control unit 31 and a decoding table memory 32.

The semiconductor device 300 of the present embodiment can realize the variable length decoding device of Embodiment 1 of the present invention shown in FIG. 1. The semiconductor device 300 of the present embodiment has the same function as the variable length decoding device of Embodiment 1 of the present invention shown in FIG. 1, and the operation is also the same. Therefore, explanation is omitted.

FIG. 18 is a block diagram illustrating another semiconductor device in Embodiment 6 of the present invention.

Figure 19:
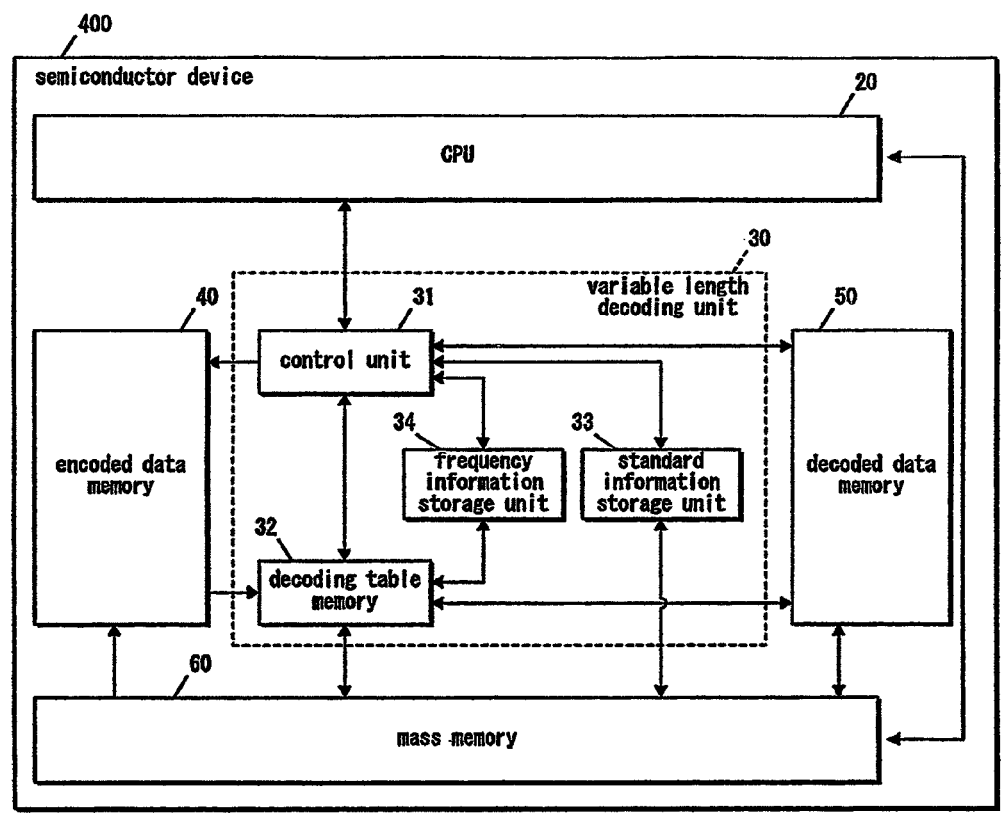
FIG. 19 is a block diagram illustrating a semiconductor device in Embodiment 6 of the present invention.

As shown in FIG. 19, a semiconductor device 400 of the present embodiment comprises a CPU 20, a variable length decoding unit 30, an encoded data memory 40, a decoded data memory 50, and a mass memory 60. The variable length decoding unit 30 possesses a control unit 31, a decoding table memory 32, a standard information storage unit 33, and a frequency information storage unit 34.

The semiconductor device 400 of the present embodiment can realize the variable length decoding device of Embodiment 4 of the present invention shown in FIG. 4. The semiconductor device 400 of the present embodiment possesses the same function as the variable length decoding device of Embodiment 1 of the present invention shown in FIG. 4, and the operation is also the same. Therefore, the explanation thereof is omitted.

In addition, in the semiconductor device 400 of the present embodiment, it is also preferable for the variable length decoding unit 30 to further include an order information storage unit 35. Then, the modified semiconductor device 400 of the present embodiment can realize the variable length decoding device of Embodiment 5 of the present invention.

In the semiconductor devices 100, 200, and 300 of the present embodiment, the respective variable length decoding unit 30 can also internally comprise the frequency information storage unit 34, similar to the variable length decoding unit 30 of the semiconductor device 400. In this way, the modified semiconductor devices 100, 200, and 300 can efficiently transfer the table data from the external or internal mass memory 60 to the decoding table memory 32 by using the frequency information, as in the variable length decoding device of Embodiment 4 of the present invention shown in FIG. 4.

Consequently, the modified semiconductor devices 100, 200, and 300, and the semiconductor device 400 of the present embodiment can efficiently transfer a part of decoding table of the encoding standard to which the encoded data inputted conforms, to the cache memory as the decoding table memory 32, using the standard information and the frequency information of the table data. Thus, it is possible to realize decoding processing in which the frequency of replacement of the decoding table and the frequency of occurrence of cache errors are reduced.

Furthermore, in the semiconductor devices 100, 200, 300 and 400 of the present embodiment, the respective variable length decoding unit 30 may further comprise an order information storage unit 35. Consequently, using the order information, the modified semiconductor devices 100, 200, 300 and 400 of the present embodiment can realize efficient decoding processing in which the frequency of occurrence of cache errors is significantly reduced in reproduction of the same motion picture.

Embodiment 7

Figure 20:
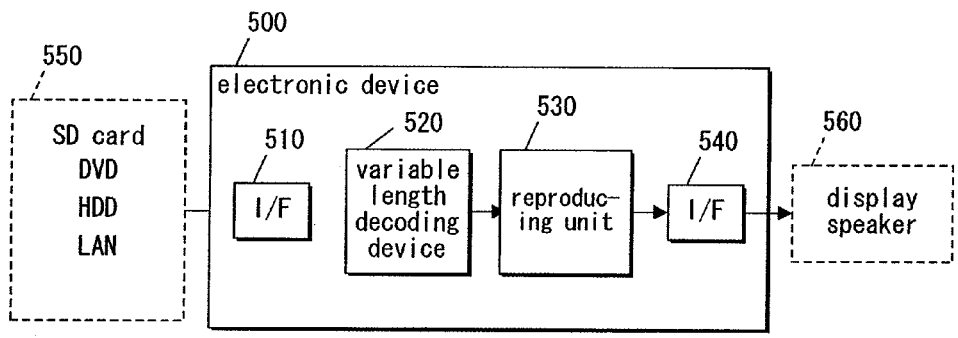
FIG. 20 is a block diagram illustrating an electronic device in Embodiment 7 of the present invention.
Figure 21:
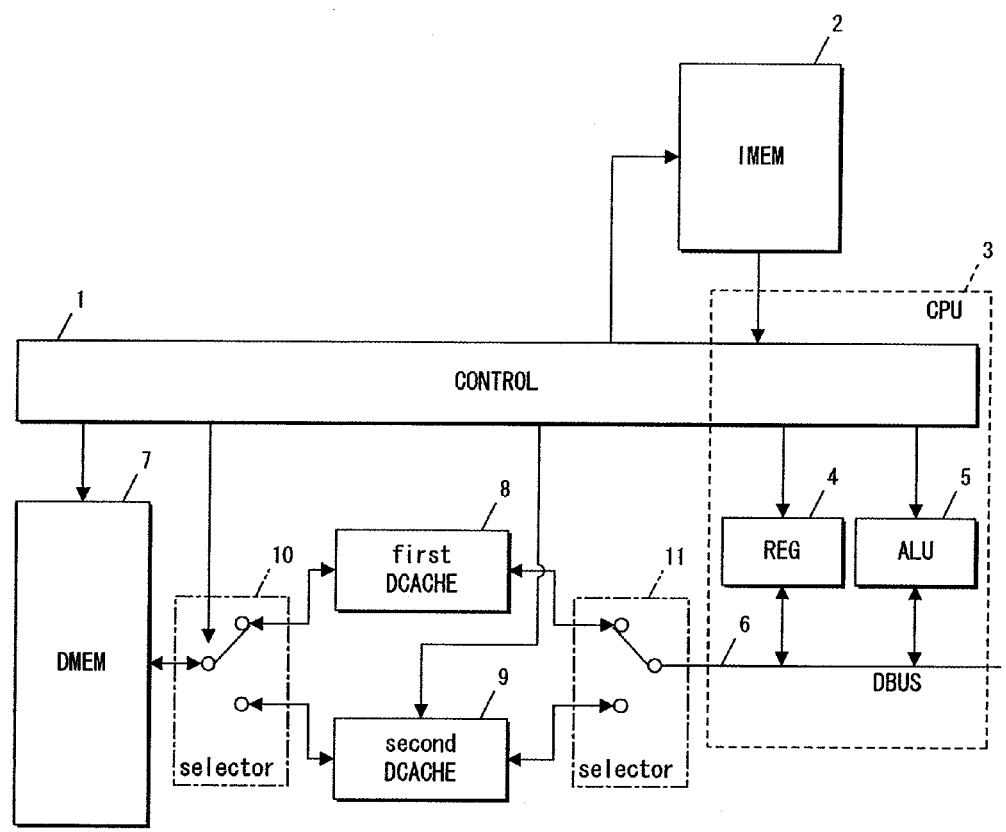
FIG. 21 is a block diagram illustrating the conventional cache memory controller.

FIG. 20 is a block diagram illustrating an electronic device in Embodiment 7 of the present invention. An electronic device 500 of the present embodiment comprises an input interfaces 510, a variable length decoding device 520, a reproducing unit 530, and an output interface 540.

An input device 550 is connected to the input interface 510. The input device 550 includes a small-sized information archive medium such as an SD card, a DVD, and an HDD, and also includes a LAN connected to the Internet. Bit stream data, including variable length encoded data of motion picture data, still picture data, audio/sound data, and others, is inputted into the input interface 510 from the input device 550.

The variable length decoding device 520 analyzes the inputted bit stream data, performs variable length decoding to the encoded data included in the bit stream data, and then generates decoded data.

The reproducing unit 530 performs signal processing to the decoded data that is generated by the variable length decoding device 520, and outputs picture signals and audio/sound signals.

An external output device 560 such as a display and a speaker is connected to the output interface 540.

The variable length decoding device 530 of the present embodiment may utilize any one of the variable length decoding devices described in Embodiments 1 to 5 of the present invention. Furthermore, the variable length decoding device 530 of the present embodiment may alternatively utilize any one of the variable length decoding device that is composed of the semiconductor device 100, the external CPU 20, and the external mass memory 60; the variable length decoding device that is composed of the semiconductor device 200 and the external mass memory 60; the semiconductor device 300; or the semiconductor device 400, as explained in Embodiment 6 of the present invention.

Thus-composed electronic device 500 of the present embodiment can efficiently decode and reproduce motion picture data, still picture data, or music data, which are variable-length-encoded in conformity with the various standards. The electronic device 500 of the present embodiment efficiently transfers a part of decoding table of the encoding standard to which the encoded data inputted conforms, to the cache memory as the decoding table memory, by using the standard information, frequency information, and order information of the table data. As a result, it is possible to realize decoding processing in which the frequency of replacement of the decoding table and the frequency of occurrence of cache errors are reduced.

In Embodiment 1 of the present invention, the standard information storage unit 70 is arranged so as to be accessible by the variable length decoding unit 30 and the CPU 20. In Embodiment 2 of the present invention, the standard information storage unit 21 is composed as a part of the CPU 20. In Embodiments 3, 4, and 5 of the present invention, the standard information storage unit 33 is composed as one element of the variable length decoding unit 30. Alternatively, however, the standard information storage unit may be arranged inside the mass memory 60 as a part thereof. As further alternative, the standard information storage unit may be arranged at the exterior of the mass memory 60 but so as to be accessible by the CPU 20.

According to the present invention, in decoding of the variable length encoded data in conformity with the various standards, it is possible to provide the variable length decoding method and variable length decoding device operable to reduce the frequency of replacement of the variable-length-code decoding table and the frequency of occurrence of cache errors.

The variable length decoding device related to the present invention can be used in electronic equipment such as a cellular phone, for which decoding variable length encoded data is necessary, and its applicable field.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A variable length decoding device configured to perform decoding of encoded data which is variable-length-encoded in conformity with one of a plurality of standards, said variable length decoding device comprising:
    a mass memory configured to store a plurality of decoding tables corresponding to the plurality of standards;
    an encoded data memory configured to store the encoded data;
    a standard information storage unit configured to store standard information on a target standard on which the encoded data is based;
    a decoding table memory configured to store a decoding table for the target standard with reference to the standard information;
    a variable length decoding unit configured to variable-length-decode the encoded data stored in said encoded data memory, with reference to the decoding table of the target standard stored in said decoding table memory, thereby generating decoded data;
    a decoded data memory configured to store the decoded data; and
    a transferring unit configured to transfer the decoding table of the target standard from said mass memory to said decoding table memory, referring to the standard information.

2. A semiconductor device configured to perform decoding of encoded data which is variable-length-encoded in conformity with one of a plurality of standards, said semiconductor device comprising:
    a standard information storage unit configured to store standard information on a target standard on which the encoded data is based;
    a decoding table memory configured to store a decoding table for the target standard with reference to the standard information;
    a variable length decoding unit configured to variable-length-decode the encoded data stored in an encoded data memory, with reference to the decoding table of the target standard stored in said decoding table memory, thereby generating decoded data; and
    a transferring unit configured to transfer the decoding table of the target standard from a mass memory to said decoding table memory, referring to the standard information.

* * * * *